(12) United States Patent
Takahata

(10) Patent No.: US 7,382,053 B2
(45) Date of Patent: Jun. 3, 2008

(54) POWER SUPPLY WIRING STRUCTURE

(75) Inventor: Atsushi Takahata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 323 days.

(21) Appl. No.: 11/183,952

(22) Filed: Jul. 19, 2005

(65) Prior Publication Data

US 2006/0017158 A1  Jan. 26, 2006

(30) Foreign Application Priority Data

Jul. 23, 2004 (JP) .......................... P2004-215606

(51) Int. Cl.
 *H01L 23/52* (2006.01)
 *H01L 23/48* (2006.01)
 *H01L 29/40* (2006.01)

(52) U.S. Cl. .............................. 257/774; 257/E23.145; 257/734; 257/758; 257/786; 716/19; 716/21; 365/200; 438/622

(58) Field of Classification Search .......... 257/E23.16, 257/E23.145, 734, 750, 763, 758, 529, 530, 257/910, 774, 786; 250/280.1, 208.1; 379/9; 365/200, 500.11; 716/19, 21; 349/40, 42; 438/622, 639, 129

See application file for complete search history.

(56) References Cited

U.S. PATENT DOCUMENTS

| | | | | |
|---|---|---|---|---|
| 5,561,327 A | * | 10/1996 | Jun | 257/758 |
| 5,783,864 A | * | 7/1998 | Dawson et al. | 257/758 |
| 5,883,434 A | * | 3/1999 | Noguchi | 257/750 |
| 6,166,441 A | * | 12/2000 | Geryk | 257/773 |
| 6,225,652 B1 | * | 5/2001 | Devanney | 257/209 |
| 6,420,787 B1 | * | 7/2002 | Kobayashi et al. | 257/777 |
| 6,519,759 B2 | * | 2/2003 | Tounai | 716/19 |
| 6,546,540 B1 | * | 4/2003 | Igarashi et al. | 716/13 |
| 6,556,658 B2 | * | 4/2003 | Brennan | 379/9 |
| 6,724,092 B2 | * | 4/2004 | Higuchi | 257/786 |
| 6,941,528 B2 | * | 9/2005 | Allen et al. | 716/2 |
| 7,134,111 B2 | * | 11/2006 | Nakamoto | 716/10 |
| 7,146,597 B2 | * | 12/2006 | Ota | 716/12 |
| 7,226,855 B2 | * | 6/2007 | Suga | 438/622 |
| 7,245,019 B2 | * | 7/2007 | Murata et al. | 257/774 |
| 7,247,553 B2 | * | 7/2007 | Ohayashi et al. | 438/622 |
| 2002/0162079 A1 | * | 10/2002 | Igarashi et al. | 716/2 |
| 2004/0181765 A1 | * | 9/2004 | Kato | 716/12 |

FOREIGN PATENT DOCUMENTS

JP            05-226331 A      9/1993

* cited by examiner

*Primary Examiner*—Chris C. Chu
(74) *Attorney, Agent, or Firm*—McDermott Will & Emery LLP

(57) ABSTRACT

Provided is a power supply wiring structure which comprises a first and a second power supply wirings, which are disposed on different planes to cross each other two-dimensionally. The first and second power supply wirings are interlayer-connected by a first via at a crossing area where those power supply wirings cross each other. An extension wiring which is formed by partially extending from the crossing area along a wiring extending direction of other power supply wiring is provided at least to either the first power supply wiring or the second power supply wiring. The extension wiring and either the first power supply wiring or the second power supply wiring, which are disposed on a different plane from the extension wiring to face the extension wiring, are interlayer-connected by a second via. Thereby, generation of electro migration can be suppressed.

11 Claims, 13 Drawing Sheets

FIG. 13A - PRIOR ART
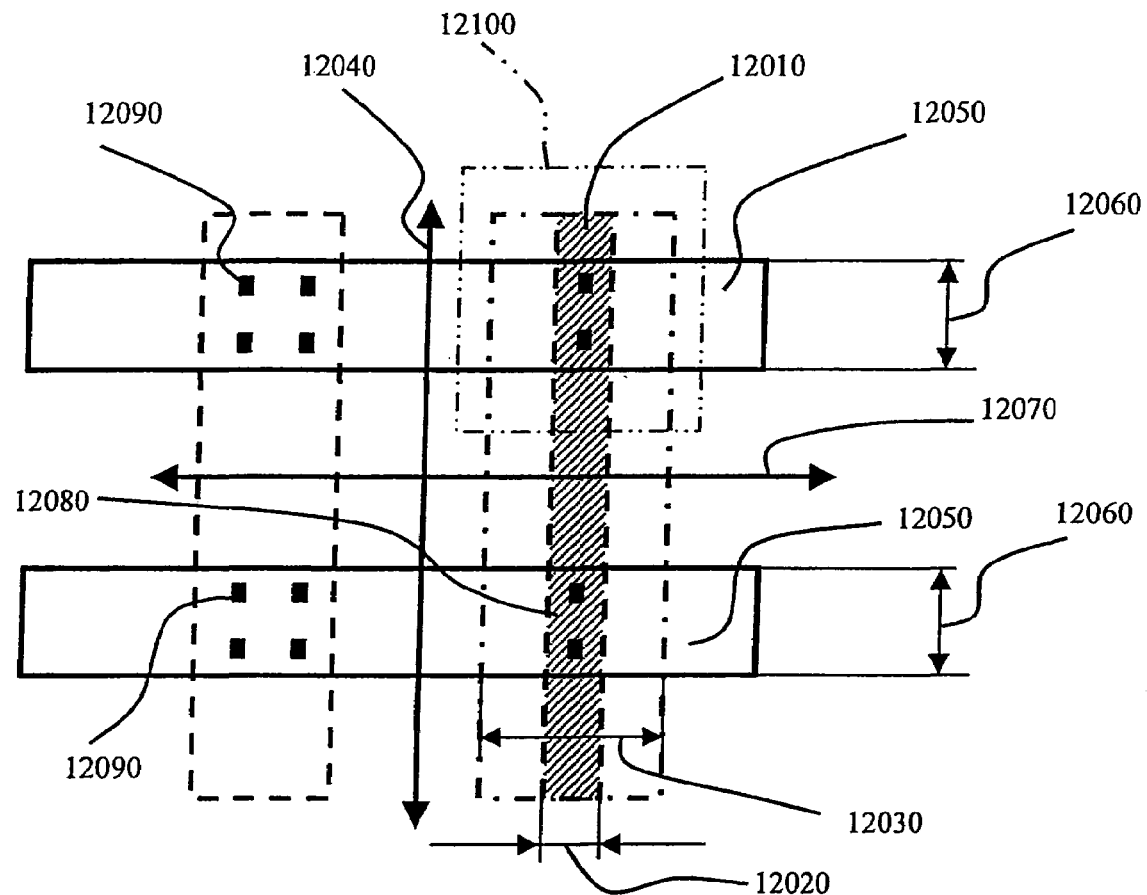
FIG. 13B - PRIOR ART
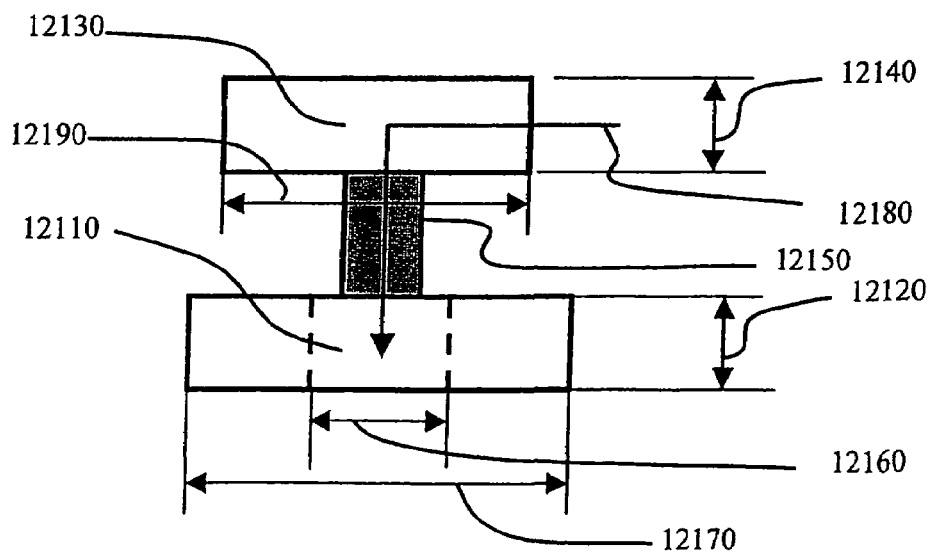

POWER SUPPLY WIRING STRUCTURE

BACKGROUND OF THE INVENTION

1. Field of the Invention

The present invention relates to a power supply wiring structure and a designing method of a power supply wiring.

2. Description of the Related Art

A semiconductor integrated circuit comprises a greater number of minute wirings such as clock wirings, signal wirings, power supply wirings, etc. compared to an ordinary conductive wiring. When an electric current is flown into such minute wirings, migration of electrons occurs. The migrated electrons urge atoms (for example, copper atoms, aluminum atoms, etc), which forms the wiring, thus causing an atomic depletion (void). Such void induces a decrease of a cross sectional area of a wiring film, an increase of the electric current density, and a temperature increase caused by Joule heat. More accelerated growth of the void finally comes to break down the wirings. Such phenomenon is referred to as electro migration (referred to as EM hereinafter).

In the recent semiconductor integrated circuit technology, gate length of transistors constituting a semiconductor integrated circuit is shortened to improve the degree of integration. When the degree of the integration is improved in this manner, it is possible to reduce the area of the semiconductor integrated circuit. However, the number of operating transistors per unit area is increased thus increasing the consumed electric current per unit area. As a result, the electric current density in the power supply wiring is increased and a problem of EM in the power supply wiring becomes significant.

In the meantime, the wiring of the semiconductor integrated circuit is formed by electrically connecting multilayer wirings through vias. With the same amount of electric current, the EM problem is more significant in the vias than in the wirings. This is due to a meteoric failure phenomenon. The meteoric failure phenomenon will be described in the followings.

In the recent manufacturing procedure of a semiconductor integrated circuit, a great number of vias are concentrated so that there is a swollen part by the vias in an area with a great number of the concentrated vias compared to an area where the vias are not concentrated. The density of via numbers per unit wiring is referred to as a via density. Due to such swollen part by the vias, the wiring becomes let out and connected to other wirings at the time of forming a wiring which is a layer over the via. Such phenomenon is referred to as the meteoric failure phenomenon.

The wiring width of the power supply wiring is wider than that of the signal wiring, so that it is possible to form a grater number of vias compared to the case of the signal wiring. Thus, in order to avoid the meteoric failure phenomenon, the power supply wiring is designed with the decreased via density. However, with this, the cross sectional area of the via is decreased due to a decrease in the via density. Thus, the EM problem is more increased.

For the EM problem as described above, in the semiconductor integrated circuit, a standard of the allowable electric current density is set and the wirings and vias therein are so constituted that the electric current density falls within the allowable electric current density.

However, the recent semiconductor integrated circuit uses a multilayer structure. Further, the semiconductor integrated circuit is formed by disposing various cells or blocks as will be described below. Specifically, the semiconductor integrated circuit is constituted by disposing various cells or blocks, e.g. logic cells such as an AND circuit and OR circuit with relatively small power consumption, sequence cells such as an FF circuit and a latch circuit, a memory cell such as SRAM with relatively a large power consumption, etc.

Because of the structural reasons, there is a locally-declined power consumption of the circuit generated in the semiconductor integrated circuit, resulting in complication of the electric current paths from the power source to the transistor. Thus, it becomes difficult to calculate the allowable electric current density of the wiring and the via. In addition, it is difficult to specify the section within the semiconductor integrated circuit where the EM becomes an issue.

Furthermore, when looking into the blocks of the semiconductor integrated circuit, there raise the following shortcomings. That is, even if the EM problem is eliminated in each block, there may have an EM problem when the power supply wiring within the block is a bypass circuit of the power supply wiring for the other high-power-consumption block though there is no EM problem generated in that block, due to the corresponding relation between the bypass circuit and the semiconductor integrated circuit as a whole.

Because of the reason described above, when designing the blocks within the semiconductor integrated circuit, it is necessary to design the circuit for excessively supplying power so as not to have the EM problem. Furthermore, when designing each block of the semiconductor integrated circuit, used is a designing method in which a power supply wiring area necessary for the block is determined based on the consumed electric current of each block, and the EM problem is not generated if the area of the power supply wiring occupying the block is a prescribed value or more. When the block design is carried out by such block designing method, there is an excessive power supply area provided in the designed block. As a result, the power supply area of the semiconductor integrated circuit is increased thus hindering the size-reduction of the semiconductor integrated circuit.

Japanese Patent Unexamined Publication (JP-A 5-226331) discloses the related art which is directed to coping with the EM problem of the vias in the power supply wiring as described above. In the followings, the power supply wiring structure of the related art will be described.

FIG. 13A and FIG. 13B illustrate an example of an electric power supply wiring structure of the related art. In FIG. 13A, reference numeral 12010 is a first power supply wiring before modification. 12020 is an original width of the first power supply wiring 12010. 12030 is a width of the power supply wiring 12010 after the modification. 12040 is a wiring extending direction of the first power supply wiring 12010. 12050 is a second power supply wiring. 12060 is a width of the second power supply wiring 12050. 12070 is a wiring extending direction of the second power supply wiring 12050. 12080 is a first power supply wiring area. 12090 is a via. 12100 is a notable power supply wiring part. The first power supply wiring 12010 illustrated in the drawings by a broken line is connected to the second power supply wiring 12050 through the via 12090. The via 12090 is disposed in an area where the first power supply wiring 12010 and the second power supply wiring 12050 cross each other. The width 12030 of the first power supply wiring 12010 after the modification is formed wider than the width 12060 of the second power supply wiring 12050.

The effect achieved by the structure of the semiconductor integrated circuit as described above will be described in the followings. In the semiconductor integrated circuit formed in multiple layers, in the manufacturing procedure thereof, a great number of different masks are stacked many times to be disposed at the same position for forming the wirings and the vias. Thus, when stacking the masks at the same position, shift in the masks cause problems, e.g. a short circuit of the wiring between the upper layer wiring and the lower layer wiring, floating of the via, etc.

In the related art for overcoming such problems, the first power supply wiring is formed with the modified width 12030 of the first power supply wiring 12010, which is wider than the width 12020 of the first power supply wiring 12010 before the modification. With this, it is possible to prevent a decrease in the yield of the semiconductor integrated circuit even if there is a shift in the position of the via in the manufacturing procedure of the semiconductor integrated circuit.

Next, FIG. 13B is a cross sectional view of the notable power supply wiring part 12100 shown in FIG. 13A. Reference numeral 12110 is a first power supply wiring 12110. 12120 is a height of the first power supply wiring 12110. 12130 is a second power supply wiring. 12140 is a height of the second power supply wiring 12130. 12150 is a via. 12160 is a width of the first power supply wiring 12110 before modification. 12170 is a width of the first power supply wiring 12110 after modification. 12180 is a flow direction of the electric current. 12190 is a width of the second power supply wiring 12130.

For the wirings of the semiconductor integrated circuit, the heights of the wirings are formed to be uniform since it is easier for manufacture. Thus, the height 12120 of the first power supply wiring 12110 and the height 12140 of the second power supply wiring are set to be an arbitrary height without any specific reasons. Further, since the heights of the wirings are uniform, in a regular state, if the width of the power supply wiring is determined, the resistance of the power supply wiring and the electric current density of the power supply wiring are determined uniquely.

The direction 12180 of the electric current flows from the second power supply wiring 12130 towards the first power supply wiring 12110 through the via 12150. In the related art, the width 12160 of the first power supply wiring 12110 before the modification is widened to the proposed width 12170 of the first power supply wiring 12110. By widening the wiring width in this manner, the resistance of the first power supply wiring 12110 is reduced so that still larger amount of the electric current is to be flown.

However, there is no increase in the number of the via 12150. Thus, even if the resistance of the first power supply wiring 12110 is reduced, there is no change in the electric current flown to the first power supply wiring 12110 from the second power supply wiring 12140. As described above, in the conventional structure, there is no measure taken for the via 12150 which is a bottleneck in overcoming the EM problem.

As is clear from those described above, the conventional structure shown in FIG. 13A and FIG. 13B is aimed at increasing the productivity (increase the yield) of the semiconductor integrated circuit, while an increase in the number of vias for the wiring is only taken as a means for avoiding a shift of the vias in the manufacturing procedure.

Next, by referring to FIG. 14A-FIG. 14C, described is a conventional method in which the number of vias for the wiring is increased. In FIG. 14A, reference numeral 13010 is a relation between the regularity of the wiring and a general yield. 13020 is a relation between the regularity of the wiring and the yield when particularly paying attention to the yield related to the via density at the crossing area between the wirings. 13030 is a relation between the overall yield and the regularity of the wiring.

When forming the wires in the semiconductor integrated circuit, by enhancing the regularity of the wirings through taking a measure such as arranging rectangular wirings at equal intervals, etc, for example, manufacture of the semiconductor integrated circuit becomes easy thus improving the productivity (yield) of the semiconductor integrated circuit. Thus, when looking at the yield, an increase in the regularity of the wiring improves the yield as can be seen in the relation 13010 between the regularity of the wiring and the yield.

However, for the overall yield of the semiconductor integrated circuit, in addition to the yield related to the regularity of the wiring, there is also the yield 13020 related to the via density at the crossing area between the wirings. By increasing the via density in the crossing area between the wirings, while the regularity of the wiring becomes deteriorated, the EM problem can be improved. For that, the yield is improved.

Therefore, when looking at the overall yield of the semiconductor integrated circuit, the overall yield 13030 is determined as a result of the multiplier of both an increase/decrease property 13010 of the ordinary yield related to the regularity of the wiring and an increase/decrease property 13020 paying attention to the via density at the crossing area of the wirings.

Further, the number of vias in the wiring will be described by referring to FIG. 14B and FIG. 14C. As shown in FIG. 13 and the like, an increase in the number of the vias enables to prevent a shift of the masks. However, if the number of the vias in all the wirings is increased in the semiconductor integrated circuit, there cause increases in the capacity of the signal wirings and in the area of the wirings. Thus, it is necessary to go with the following relational expressions for the number of vias.

Referring to FIG. 14B, in an area where an increase in the area and the wiring capacity is not a problem, the relation can be expressed by a following relational expression:

Number of vias=number which causes no problem in manufacturing procedure+α  (1)

Next, referring to FIG. 14C, in an area where an increase in the area and the wiring capacity is a problem, the relation can be expressed by a following relational expression:

Number of vias<number which causes no problem in manufacturing procedure+α  (2)

Based on these, since there are larger areas of the above-mentioned expressions (1) in the related art, it enables to reduce the possibilities of causing shift of the vias in the semiconductor integrated circuit.

Furthermore, as semiconductor integrated circuit designing methods, there are many designing methods in which a desired semiconductor integrated circuit is formed by stacking wirings in a rectangular shape as the wiring shape since it is easier to manufacture.

In the semiconductor integrated circuit, EM in the wiring and the via is an issue. Particularly, EM is a problem in the power supply wiring, since power is supplied to each transistor of the semiconductor integrated circuit therethrough and also a larger amount of electric current is flown compared to that of the signal wiring. Furthermore, in the recent designing method of the semiconductor integrated circuit, the via density is decreased to cope with the meteoric failure phenomenon. In addition, due to the substrate structure, when the cross sectional area of the wiring and that of the via being orthogonal to the direction of the electric current are compared, the cross sectional area of the via being orthogonal to the direction of the electric current is smaller than that of the wiring. Therefore, the EM problem is significant in the via. Further, in the multilayer structure which is used in the recent semiconductor integrated circuit, the electric current paths to the transistors become complicated so that it becomes difficult to cope with the EM by calculating the electric current density of the vias in each wiring layer and stage, which is locally concentrated.

In the power supply wiring structure shown in FIG. 13A and FIG. 13B, the wiring width of the power supply wiring where the EM is significant is widened so that the area of the power supply wiring is increased. Further, since designs of the power supply wiring and the signal wiring are modified for expanding the power supply wiring after detecting the section where the EM becomes an issue, there requires a great number of complicated steps for modifying the semiconductor integrated circuit. Moreover, in the semiconductor integrated circuit shown in FIG. 13B, the width 1219 of the second power supply wiring is simply widened to the still wider width 1217 of the power supply wiring, and there is no measure taken for the via where the EM problem becomes most significant.

Further, the number of vias in the power supply wiring structure of the related art corresponds to the shift of the vias caused in the manufacturing procedure of the semiconductor integrated circuit, which is designated in accordance with the expressions (1), (2) when determining the number of the vias in the wirings. Thus, it is not possible to cope with the EM problem of the vias when it occurs, thereby deteriorating the productivity (yield) of the semiconductor integrated circuit.

SUMMARY OF THE INVENTION

Therefore, a main object of the present invention is to provide a power supply wiring structure which can suppress generation of electro migration.

In order to overcome the aforementioned problems, the power supply wiring of the present invention comprises:

a first and a second power supply wirings, which are disposed on different planes to cross each other two-dimensionally;

a first via for interlayer-connecting the first and second power supply wirings at a crossing area where the power supply wirings cross each other;

an extension wiring which is formed by partially extending at least either the first power supply wiring or the second power supply wiring from the crossing area along a wiring extending direction of the other power supply wiring; and a second via for interlayer-connecting the extension wiring and either the first power supply wiring or the second power supply wiring, which are disposed on a plane different from the extension wiring to face the extension wiring.

With the above-described configuration, it is possible to form a power supply wiring with EM resistance by connecting the extension wiring and the power supply wiring using one or more of the second via. Thus, in a semiconductor integrated circuit, the number of the first vias which causes an EM problem is specified for applying the power supply wiring stricture of the present invention. Thereby, the areas where EM becomes and issue can be reduced thus enabling to shorten the procedure for correcting the EM.

Further, in the semiconductor integrated circuit comprising the above-described power supply wiring structure, it is possible to cope with the EM by only modification performed at the crossing areas of both power supply wirings. Thus, it is possible to cope with the EM by only a necessary and minimum increase in the power supply wiring area. Therefore, it enables to reduce the area of power supply, which is provided for suppressing the EM. For this, the size of the semiconductor integrated circuit can be reduced.

Furthermore, the inventors of the present invention has found the correlation between a decrease in the yield of the semiconductor integrated circuit by shift of the vias and a decrease in the yield of the semiconductor integrated circuit due to the EM problem of the vias in terms of the overall yield of the semiconductor integrated circuit. By overcoming the EM problem through setting the via density to the optimum based on such correlation, the overall yield of the semiconductor integrated circuit can be improved.

Moreover, for the via where EM is an issue, the cross sectional area of the via is increased in accordance with the direction of the electric current. Thereby, the EM resistance can be further improved.

BRIEF DESCRIPTION OF THE DRAWINGS

Other objects of the present invention will become clear from the following description of the preferred embodiments and the appended claims. Those skilled in the art will appreciate that there are many other features and advantages of the present invention possible by embodying the present invention.

FIG. 13A and FIG. 13B are block diagrams of a conventional semiconductor integrated circuit.

DETAILED DESCRIPTION OF THE INVENTION

In the followings, preferred embodiments of the present invention will be described by referring to the accompanying drawings. In the present invention, in order to make the description as simple as possible unless there is any specific reasons, description is provided by referring to a semiconductor integrated circuit with a double-layer structure of the power supply wiring, which comprises a first power supply wiring and a second power supply wiring, wherein the first power supply wiring and the second power supply wiring are electrically connected by a via.

An embodiment of the present invention will be described by referring to FIG. 1.

Figure 1:
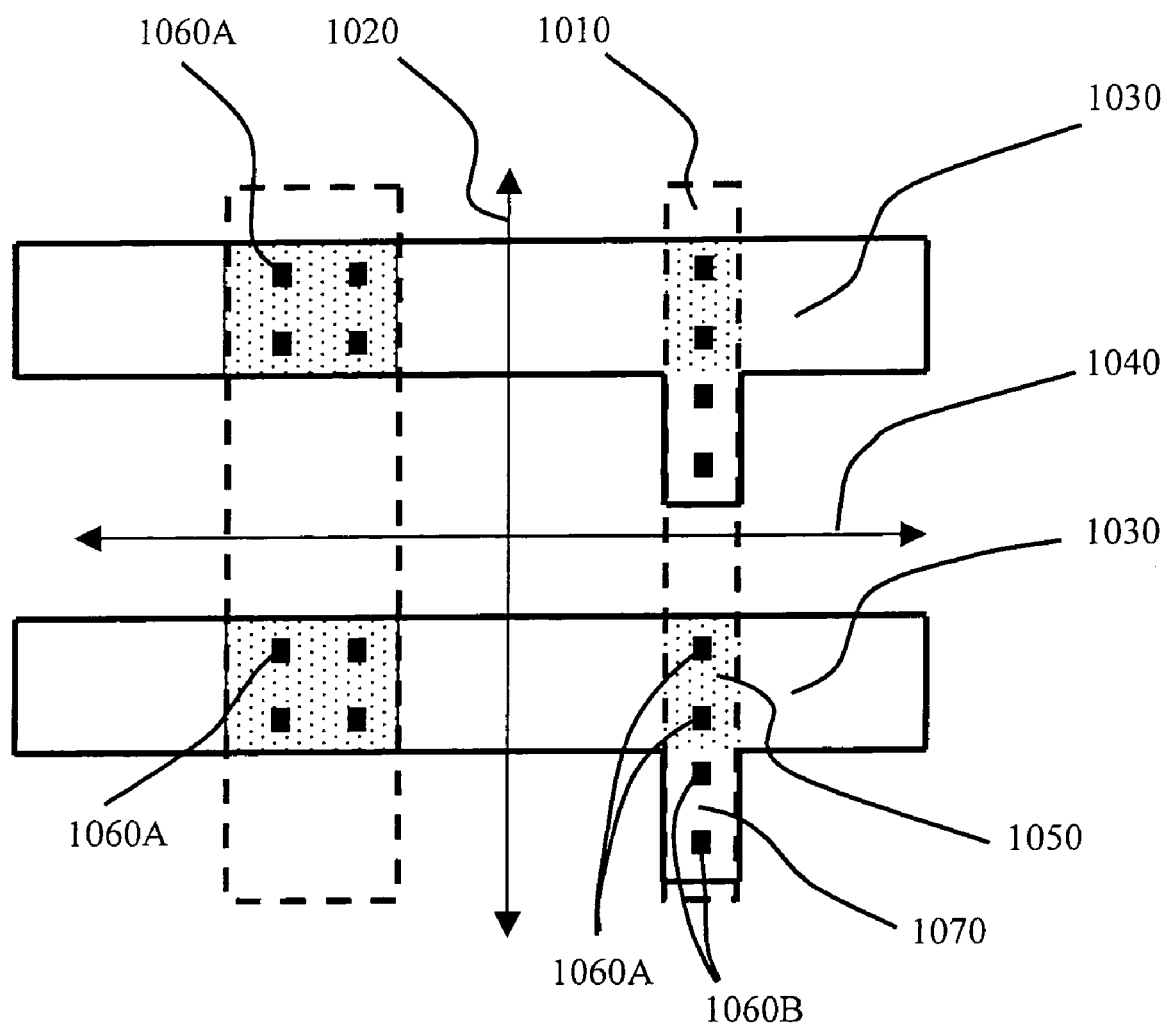
FIG. 1 is a block diagram of a semiconductor integrated circuit according to an embodiment of the present invention.

In FIG. 1, reference numeral 1010 is a first power supply wiring. 1020 is a wiring extending direction of the first power supply wiring 1010. 1030 is a second power supply wiring. 1040 is a wiring extending direction of the second power supply wiring 1020. 1050 is a crossing area of the first power supply wiring 1010 and the second power supply wiring 1030. 1060A is a first via and 1060B is a second via. 1070 is an extension wiring.

The second power supply wiring 1030 is disposed in a direction orthogonal to the first power supply wiring 1010. The wiring extending direction 1020 of the first power supply wiring 1010 and the wiring extending direction 1040 of the second power supply wiring 1030 are orthogonal to each other.

The first power supply wiring 1010 and the second power supply wiring 1030 are wiring layers which are different from each other. The extension wiring 1070 is in a shape extended out from the second power supply wiring 1030, and both wirings 1030 and 1070 are the same wiring layer. That is, at the crossing area 1050 where there may have the EM problem, both side or one side (one side in this embodiment) of the second power supply wiring 1030 extends along the wiring extending direction 1020 of the first power supply wiring 1010, and the extension wiring 1070 is formed with the extended portion of the second power supply wiring 1030.

Although crossing each other at the crossing area 1050, the first power supply wiring 1010 and the second power supply wiring 1030 are disposed on planes in different heights from each other. Between both power supply wirings 1010 and 1030, an insulating layer (not shown) is disposed for electrically isolating those wirings. The first via 1060A couples the first power supply wiring 1010 and the second power supply wiring 1030 at the crossing area 1050 for achieving interlayer connection. The second via 1060B interlayer-connects the first power supply wire 1010 and the extension wiring 1070.

The effects of the power supply wiring structure with the above-described configuration will be described hereinafter. For simplifying the description, the tolerance of via for the EM on a semiconductor integrated circuit to which the power supply wiring structure of the embodiment is applied is assumed to be four or more as the number of vias in each connection part between the first power supply wiring 1010 and the second power supply wiring 1030.

Furthermore, it is assumed that the first via 1060A is provided between the first power supply wiring 1010 and the second power supply wiring 1030 at the crossing area 1050, and that two first vias 1060A are provided for connecting the first power supply wiring 1010 and the second power supply wiring 1030. On this assumption, the number of the vias connecting the first power supply wiring 1010 and the second power supply wiring 1030 becomes less than the tolerance for the EM (the via number of four or more). Thus, there may have the EM problem.

Thus, the second power supply wiring 1030 is extended on both sides or one side (one side in the embodiment) of the wiring extending direction 1020 of the first power supply wiring for providing the extension wiring 1070. The extension wiring 1070 and the first power supply wiring 1010 are interlayer-connected by the second via 1060B.

With the configuration as described above, the number of the vias for connecting the first power supply wiring 1010 and the second power supply wiring 1030 can be increased by two through providing the extension wiring 1070 to the second power supply wiring 1030. Thus, the number of the vias for connecting the first power supply wiring 1010 and the second power supply wiring 1030 becomes a total of four. Thereby, it enables to attain a semiconductor integrated circuit which comprises the power supply wiring structure capable of avoiding the EM problem.

The number of vias, which causes no EM problem, can be obtained by the following expression, where the allowable electric current density of the EM is Imax, the maximum allowable value of the via is Ivia, and the designing margin is α:

$$\text{Number of vias} \geq I\text{max}/I\text{via} + \alpha \qquad (3)$$

By designing the power supply wiring after setting the number of vias through the expression (3), it is possible to provide the semiconductor integrated circuit having EM resistance.

By designing the semiconductor integrated circuit according to the via number calculating expression as described above, even though the regularity of the wiring is deteriorated (complicated) to some extent, it enables to improve the total productivity (yield) of the semiconductor integrated circuit by overcoming the EM problem.

Figure 2A:
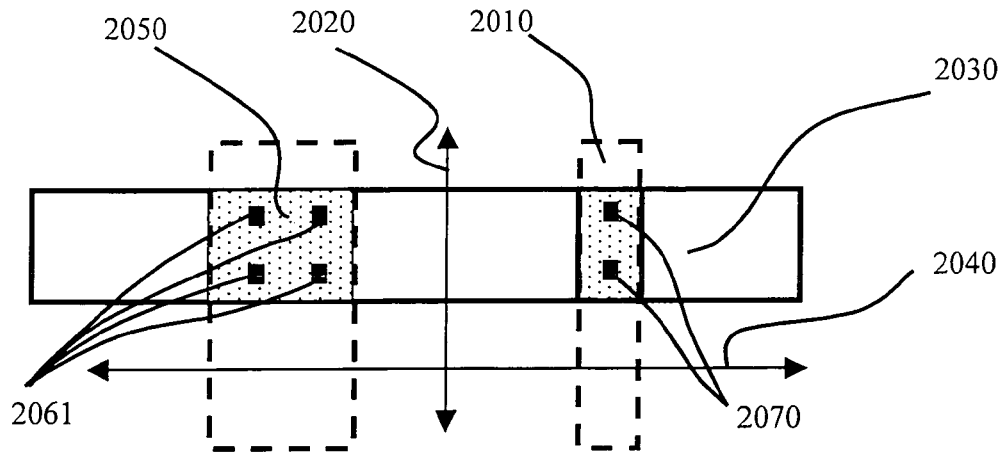
FIG. 2A and FIG. 2B are block diagrams for illustrating a designing method of a semiconductor integrated circuit according to another embodiment of the present invention.

By referring to FIG. 2, described is a method of designing the semiconductor integrated circuit using the power supply wiring structure of FIG. 1. FIG. 2A shows an example of the wiring and the via of the semiconductor integrated circuit, which have the EM problem.

In FIG. 2A, reference numeral 2010 is a first power supply wiring. 2020 is a wiring extending direction of the first power supply wiring 2010. 2030 is a second power supply wiring. 2040 is a wiring extending direction of the second power supply wiring 2030. 2050 is a crossing area of the first power supply wiring 2010 and the second power supply wiring 2030. 2061 is a first via group comprising four vias, and 2070 is a first via group comprising two vias.

For simplifying the description, the tolerance for the EM in the semiconductor integrated circuit is assumed to be four or more in terms of the number of vias used for connecting the first power supply wiring 2010 and the second power supply wiring 2030.

In the configuration of FIG. 2A, EM is not a problem in the crossing area 2050 with the first via group 2061 which comprises four vias, since the number of vias is four. However, EM is a problem in the crossing area 2050 with the first via group 2070 which comprises two vias, since the number of vias is two.

Figure 2B:
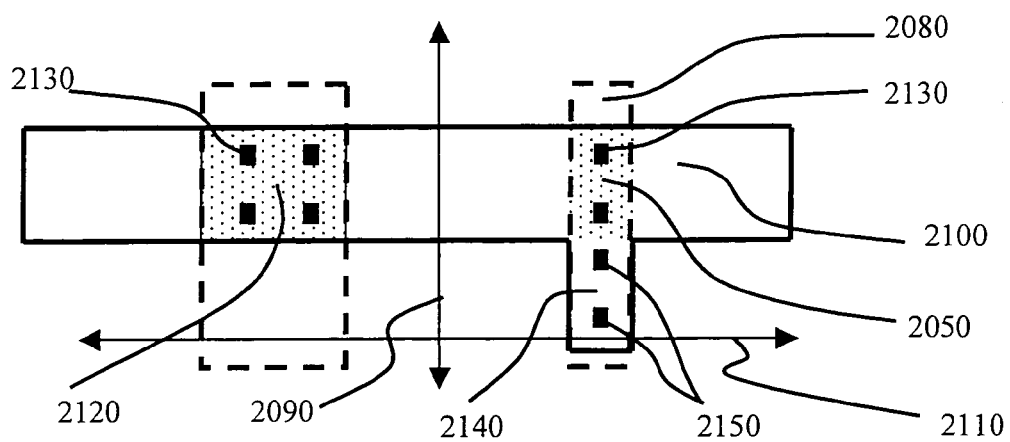

FIG. 2B shows the power supply wiring structure of the present invention in which the EM problem is overcome in the same structure as that of FIG. 2A. In FIG. 2B, reference numeral 2080 is a first power supply wiring. 2090 is a wiring extending direction of the first power supply wiring 2080. 2100 is a second power supply wiring. 2110 is a wiring extending direction of the second power supply wiring 2100.

2120 is a crossing area of the first power supply wiring 2080 and the second power supply wiring 2100. 2130 is a first via. 2140 is an extension wiring. 2150 is a second via for connecting the first power supply wiring 2080 and the second power supply wiring 2100.

A part of the second power supply wiring 2100 is extended out along the wiring extending direction 2090 of the first power supply wiring 2080 on both side or one side (one side in this embodiment), and the extension wiring 2140 is formed by the extended portion of the second power supply wiring 2100.

In the configuration of FIG. 2B, in the crossing area 2050 where two first vias 2130 for connecting the first power supply wiring 2080 and the second power supply wiring 2100 are provided, two second vias 2140 for connecting the first power supply wiring 2080 and the extension wiring 2140 are additionally disposed. Thus, there are four vias in total so that the EM problem is not caused.

Figure 2C:
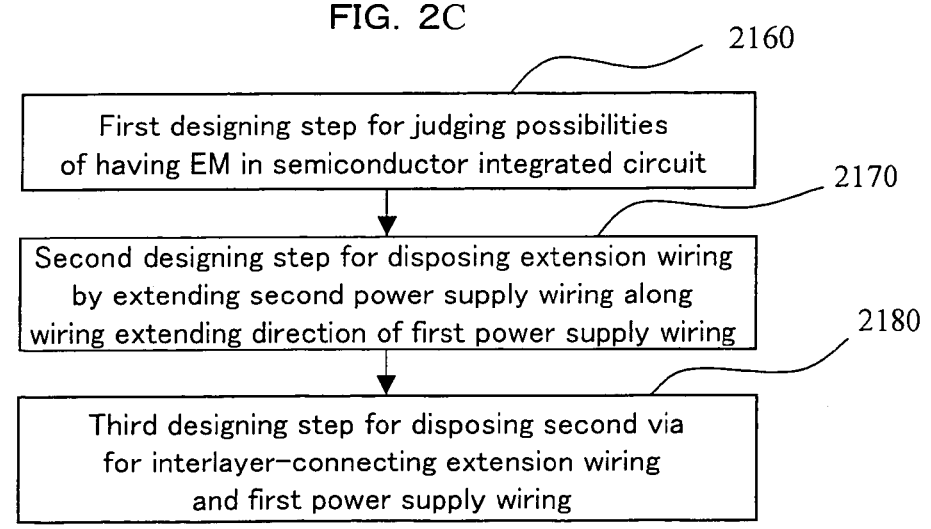
FIG. 2C is a flowchart for describing the designing method of the semiconductor integrated circuit of the embodiment shown in FIG. 2A and FIG. 2B.

By referring to FIG. 2C, described is a method for modifying the design of the power supply wiring structure of FIG. 2A to the design of the power supply wiring structure of FIG. 2B. First, possibilities of having the EM in the power supply wiring structure of the semiconductor integrated circuit are judged. Specifically, the possibilities of having the EM at the respective crossing areas 2050 are determined (a first designing step 2160) by judging whether or not the number of the first vias in the crossing area 2050 becomes less than four.

Then, the wiring structures of the second power supply wirings 2030 and 2100 in the sections (the crossing areas 2050 and 2120) where it is judged to have possibilities of causing EM are design-modified as follows. That is, the second power supply wirings 2030 and 2100 in this part (crossing areas 2050 and 2120) are extended along the first power supply wiring extending directions 2020 and 2090 so as to provide the extension wiring 2140 (a second designing step 2170).

Next, the second via 2150 for connecting the formed extension wiring 2140 and the first power supply wiring 2080 is disposed (a third designing step 2180).

If the first power supply wirings 2010, 2080 and the second power supply wirings 2030, 2100 are connected by two first vias 2070, 2130, two or more of the second vias 2150 are used to connect the first power supply wiring 2080 and the extension wiring 2140. That is, it is set so that the number of vias, which is the total number of the first vias 2130 in the connecting section between the first power supply wiring 2010 and the second power supply wirings 2030, 2100, and the second vias 2150, becomes the tolerance for the EM or more. With this, it is possible to achieve the power supply wiring structure having no EM problem. Therefore, the semiconductor integrated circuit with this power supply siring structure becomes excellent in the EM resistance.

Figure 3:
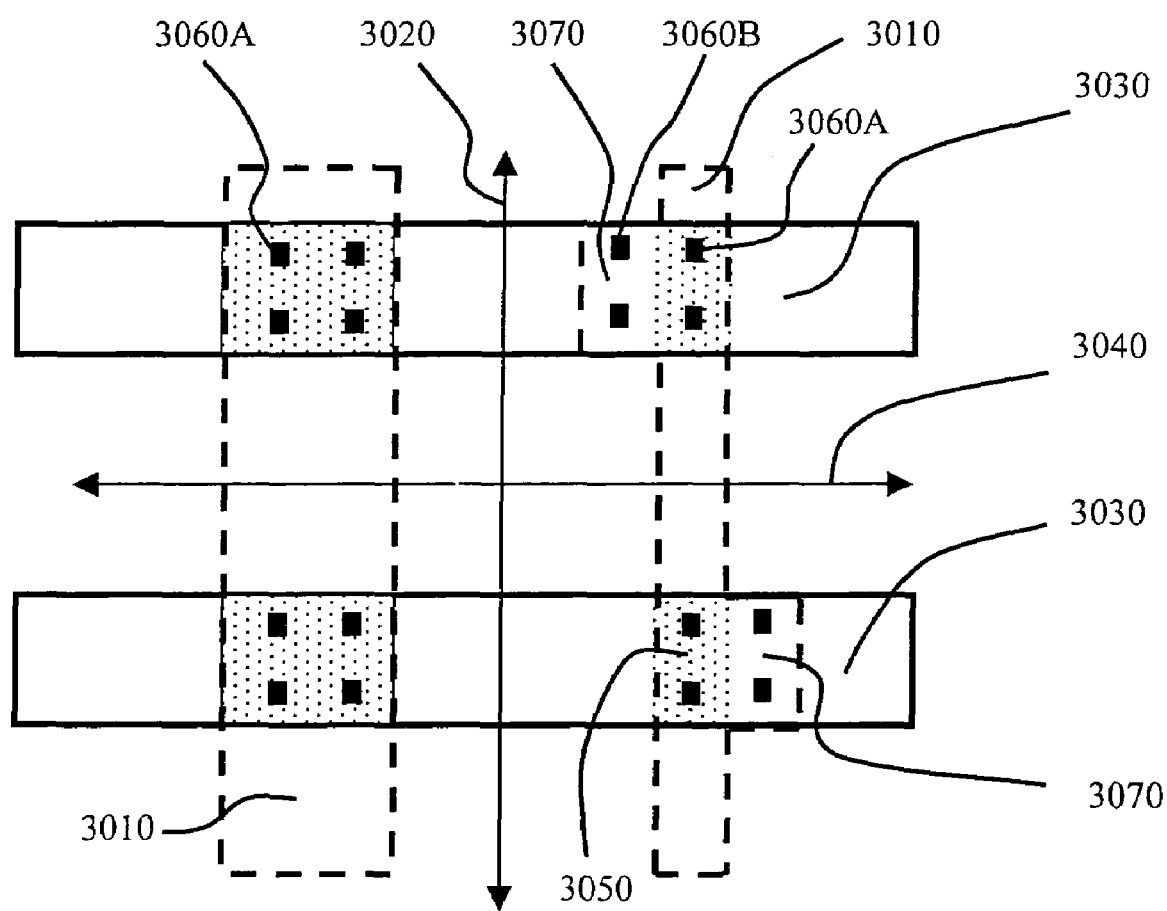
FIG. 3 is a block diagram of a semiconductor integrated circuit according to still another embodiment of the present invention.

Another embodiment will be described by referring to FIG. 3. In FIG. 3, reference numeral 3010 is a first power supply wiring. 3020 is a wiring extending direction of the first power supply wiring 3010. 3030 is a second power supply wiring. 3040 is a wiring extending direction of the second power supply wiring 3030. 3050 is a crossing area of the first power supply wiring 3010 and the second power supply wiring 3030. 3060A is a first via and 3060B is a second via. 3070 is an extension wiring. The configurations of the first power supply wiring 3010, the second power supply wiring 3030, the crossing area 3050, the first via 3060A, the second via 3060B, and the tolerance for EM in the crossing area 3050 are basically the same as those of the above-described embodiment.

The extension wiring 3070 and the first power supply wiring 3010 are formed by the same wiring layer with respect to each other. The extension wiring 3070 is formed by extending a part of the first power supply wiring 3010 on both sides or one side (one side in this embodiment) of the wiring extending direction 3040 of the second power supply wiring 3030. "Both sides" and/or "one side" herein indicate the part of the first power supply wiring 3010 along the direction which is almost orthogonal to the wiring extending direction 3040.

The first power supply wiring 3010 is connected to the second power supply wiring 3030 through the first via 3060A, and connected to the extension wirings 3070 through the second via 3060B. The number of the first vias 2060A functioning as an interlayer connecting member in an arbitrary crossing area 3050 is two, which cause the EM problem. However, the number of the second vias 3060B functioning as an interlayer connecting member between the extension wiring 3070 and the second power supply wiring 3030 which are provided continuously in the crossing area is two. Thus, in total, the number of the first and second vias 3060A and 3060B functioning as the interlayer connecting members in the crossing area 3050 becomes four, which is the number causing no EM problem. The example shown in FIG. 3 is an example of the structure where extending directions of the respective extension wirings 2070 are different from each other.

Figure 4:
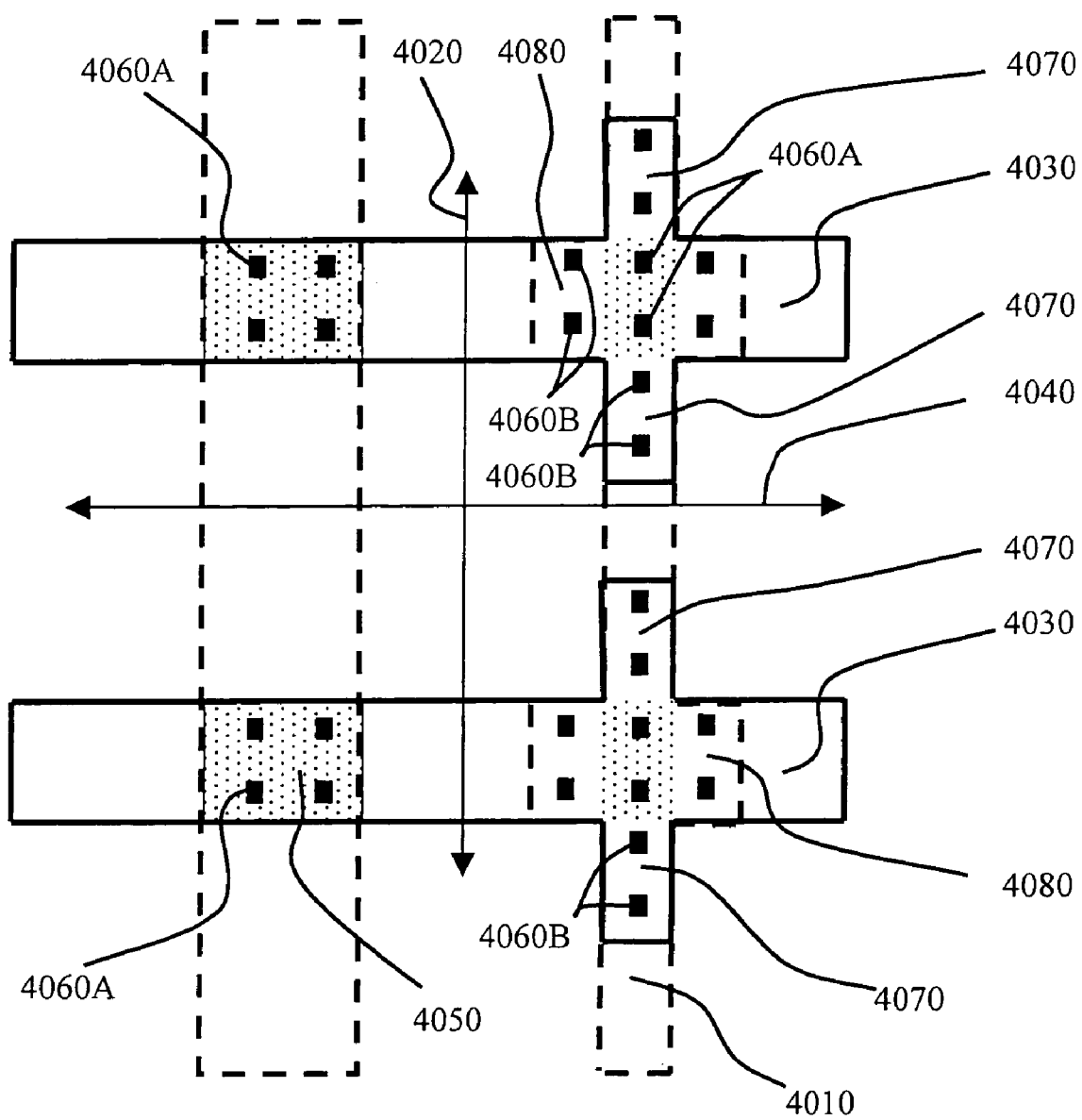
FIG. 4 is a block diagram of a semiconductor integrated circuit according to yet another embodiment of the present invention.

Another embodiment will be described by referring to FIG. 4. In FIG. 4, reference numeral 4010 is a first power supply wiring. 4020 is a wiring extending direction of the first power supply wiring 4010. 4030 is a second power supply wiring. 4040 is a wiring extending direction of the second power supply wiring 4030. 4050 is a crossing area of the first power supply wiring 4010 and the second power supply wiring 4030. 4060A is a first via and 4060B is a second via. 4070 and 4080 are extension wirings. The configurations of the first power supply wiring 4010, the second power supply wiring 4030, the extension wirings 4070, 4080, the crossing area 4050, the first via 4060A, the second via 4060B, and the tolerance for EM in the vias are basically the same as those of the above-described embodiment.

The extension wiring 4080 and the first power supply wiring 4010 are formed by the same wiring layer with respect to each other. The extension wiring 4080 is formed by extending the first power supply wiring 4010 towards the both sides of the second power supply wiring extending direction 4040.

The extension wiring 4070 and the second power supply wiring 4030 are formed by the same wiring layer with respect to each other. The extension wiring 4070 is formed by extending the second power supply wiring 4030 towards the both sides of the first power supply wiring extending direction 4020.

The above-described "both sides" herein indicates the part of the first power supply wiring 4010 or the second power supply wiring 4030 along the directions which are almost orthogonal to the wiring extending directions 4040 and 4020.

By providing the extension wirings 4070, 4080, the interlayer connecting part (crossing area 4050) between the first power supply wiring 4010 and the second power supply wiring 4030 is connected by the vias (first and second vias 4060A, 4060B) in the number (four or more in this example) which cause no EM problem. In this example, the extension wirings 4070 and 4080 are provided in both the first power supply wiring 4010 and the second power supply wiring 4030.

Figure 5:
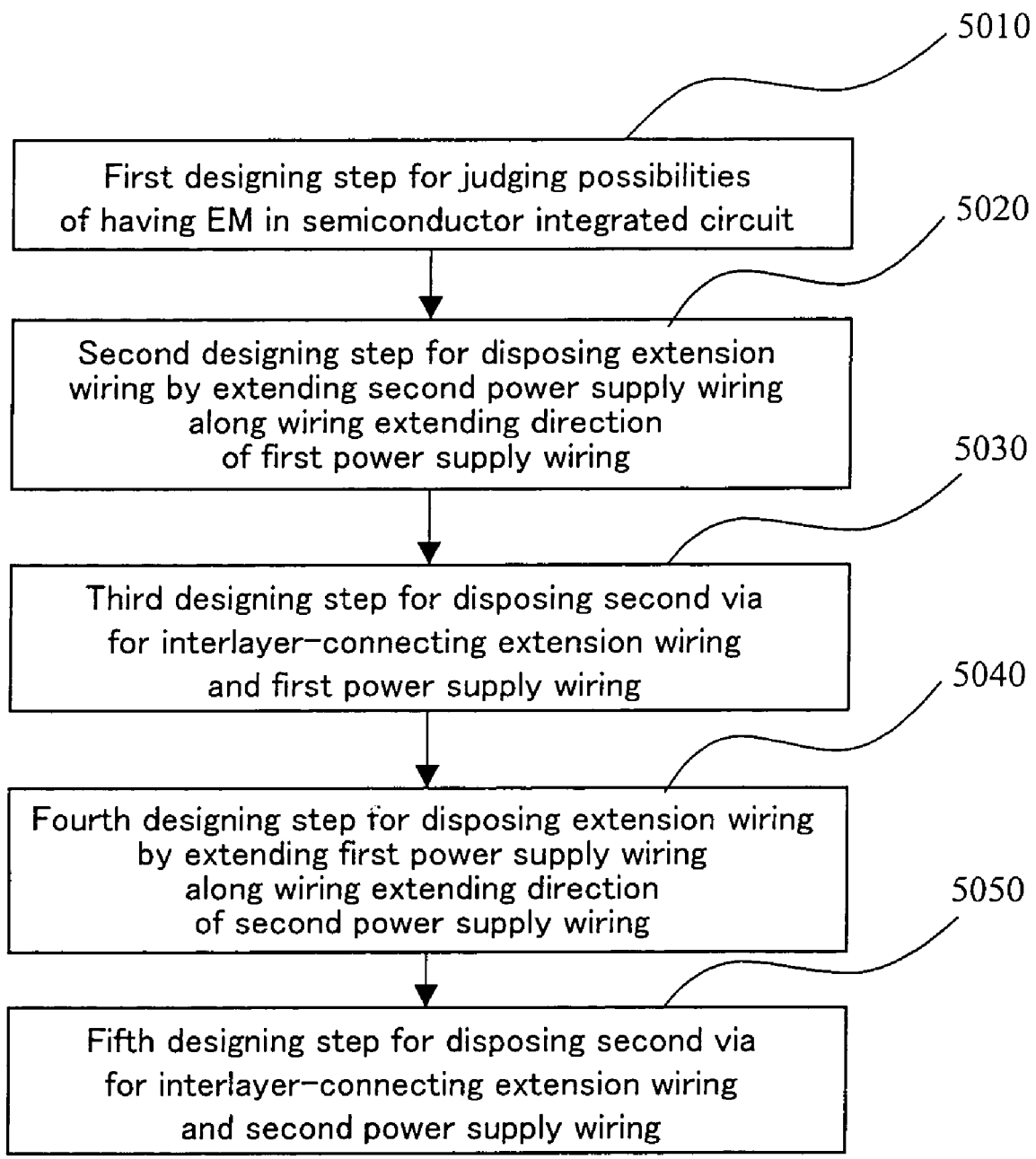
FIG. 5 is a flowchart for describing a designing method of the semiconductor integrated circuit shown in FIG. 4.

A designing method for modifying the design to the power supply wiring of FIG. 4 will be described by referring to FIG. 5. First, possibilities of having the EM in the power supply wiring structure of the semiconductor integrated circuit are judged. In a first step 5010, the possibilities of causing the EM at the respective crossing areas 4050 are determined by judging whether or not the number of the vias in the crossing area 4050 becomes less than four (the first designing step 5010).

Then, the wiring structure of the second power supply wirings 4030 in the section (the crossing area 4050) where it is judged to have possibilities of causing EM is design-modified as follows. That is, the second power supply wiring 4030 in this part (the crossing area 4050) is extended along the first power supply wiring extending direction 4020 so as to provide the extension wiring 4070 (a second designing step 5020).

Then, the second via 4060B for interlayer-connecting the formed extension wiring 4070 and the first power supply wiring 4010 is disposed (a third designing step 5030).

Subsequently, the wiring structure of the first power supply wirings 4010 in the section (the crossing area 4050) where it is judged to have possibilities of causing EM is design-modified as follows. That is, the first power supply wiring 4010 in this part (the crossing area 4050) is extended along the second power supply wiring extending direction 4040 so as to provide the extension wiring 4080 (a fourth designing step 5040).

Then, the second via 4060B for interlayer-connecting the formed extension wiring 4080 and the second power supply wiring 4030 is disposed (a fifth designing step 5050).

If the first power supply wiring 4010 and the second power supply wiring 4030 are connected at the connecting part (the crossing area 4050) by two of the first vias 4060A, it is designed so that the total number of the second vias 4060B connecting the first power supply wiring 4010 to the extension wiring 4070 and the second vias 4060B connecting the second power supply wiring 4030 to the extension wiring 4080 becomes two or more. With, it becomes possible to attain the power supply wiring structure having no EM problem. Therefore, the semiconductor integrated circuit comprising this structure comes to have an excellent EM resistance.

Figure 6:
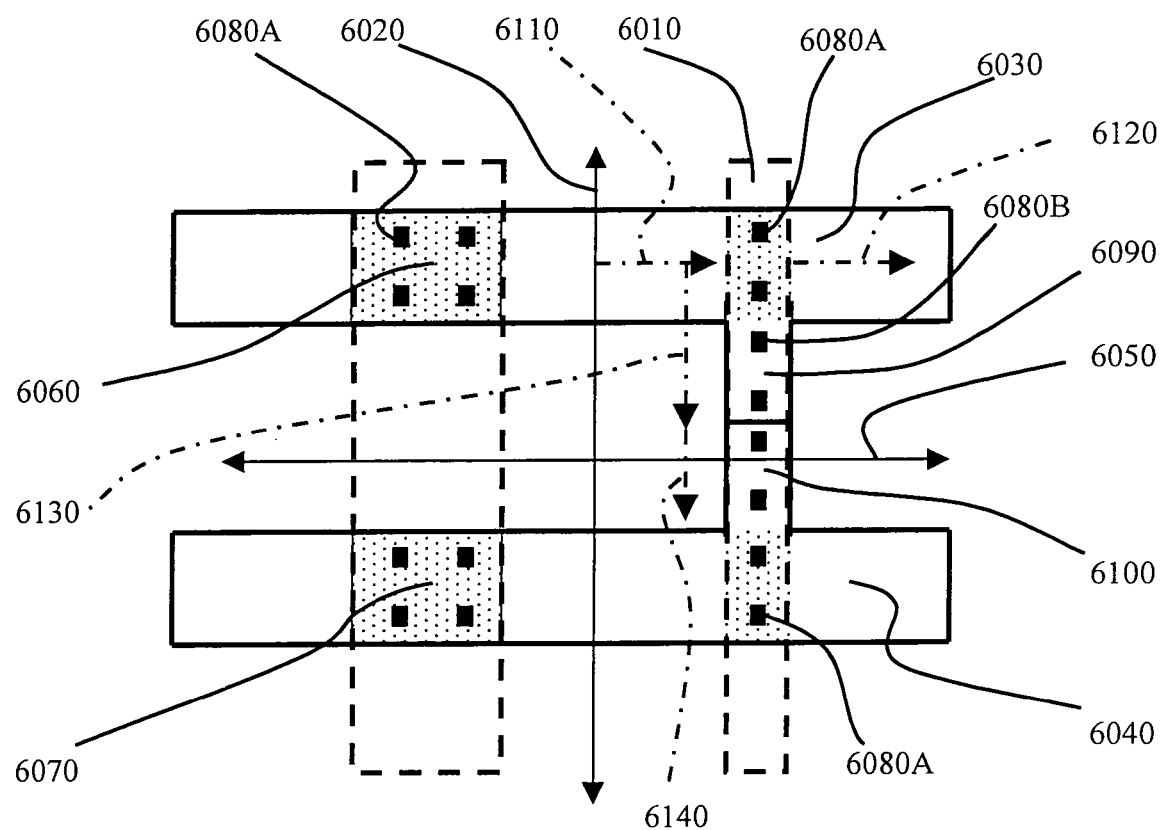
FIG. 6 is block diagram of a semiconductor integrated circuit according to another embodiment of the present invention.

Another embodiment will be described by referring to FIG. 6. In FIG. 6, reference numeral 6010 is a first power supply wiring. 6020 is a wiring extending direction of the first power supply wiring 6010. 6030 is one of second power supply wirings and 6040 is the other second power supply wiring. 6050 is a wiring extending direction of the second power supply wirings 6030 and 6040. 6060 is a crossing area of the first power supply wiring 6010 and the second power supply wiring 6030. 6070 is a crossing area of the first power supply wiring 6010 and the other second power supply wiring 6040. 6080A is a first via and 6080B is a second via. 6090 is a first extension wiring and 6100 is a second extension wiring. 6110 is an electric current (I) flown in the one second power supply wiring 6030 and 6120 is a branch electric current ($I_1$) flown in the other second power supply wiring 6030. 6130 is an electric current ($I_2$) flown in the first extension wiring 6090 and 6140 is an electric current ($I_3$) flown in the second extension wiring 6100.

The first power supply wiring 6010 and the second power supply wirings 6030, 6040 are wiring layers which are different from each other. The one second power supply wiring 6030 and the other second power supply wiring 6040 are the same wiring layer. However, both of the power supply wirings 6030 and 6040 are disposed roughly in parallel to each other. Furthermore, the second power supply wirings 6030, 6040 are disposed on a plane different form that of the first power supply wiring 6010 by facing a direction roughly orthogonal to the first power supply wiring 6010 when viewed two-dimensionally. Thus, the wiring extending direction 6050 of both second power supply wirings 6030, 6040 and the wiring extending direction 6020 of the first power supply wiring 6010 are orthogonal to each other.

The first extension wiring 6090 is in a shape extended out from the one second power supply wiring 6030, and both wirings 6030 and 6090 are the same wiring layer. That is, in the crossing area 6060 with the possibilities of having the EM problem, the one second power supply wiring 6030 has the other second power supply wiring side extended along the wiring extending direction 6020 of the first power supply wiring 6010. The first extension wiring 6090 is formed by the extended portion of the one second power supply wiring 6030.

The second extension wiring 6100 is in a shape extended out from the other second power supply wiring 6040, and both wirings 6100 and 6040 are the same wiring layer. That is, in the crossing area 6070 with the possibilities of having the EM problem, the other second power supply wiring 6040 has the one second power supply wiring side extended along the wiring extending direction 6020 of the first power supply wiring 6010. The second extension wiring 6100 is formed by the extended portion of the other second power supply wiring 6040.

The one second power supply wiring 6030 and the other second power supply wiring 6040 are disposed on the same plane. Although crossing each other at the crossing areas 6060, 6070, these second power supply wirings 6030, 6040 and the first power supply wiring 6010 are disposed on planes whose heights are different from each other. The first via 6080A interlayer-connects the first power supply wiring 6010 and the one second power supply wiring 6030 at the crossing area 6060, and interlayer-connects the first power supply wiring 6010 and the other second power supply wiring 6040 at the crossing area 6070. Further, the second via 6080B interlayer-connects the first power supply wiring 6010 and the first extension wiring 6090, and interlayer-connects the first power supply wiring 6010 and the second extension wiring 6100.

Furthermore, the first extension wiring 6090 and the second extension wiring 6100 are coupled and disposed on the same plane to be connected to each other.

In the above-described power supply wiring structure, when the first extension wiring 6090 and the second extension wiring 6100 are electrically isolated, the relation between the electric current (I) flown in the one second power supply wiring 6030, the branch electric current ($I_1$) flown in the one second power supply wiring 6030, and the electric current ($I_2$) flown in the first extension wiring 6090 can be expressed by a following expression (4):

$$(I)=(I_1)+(I_2) \tag{4}$$

When the first extension wiring 6090 and the second extension wiring 6100 are connected as in the case of this embodiment, the relation between the electric current (I), the branch electric current ($I_1$), the electric current ($I_2$) and the electric current ($I_3$) flown in the second extension wiring 6100 can be expressed by a following expression (5):

$$(I) = (I_1) + (I_2) + (I_3) \qquad (5)$$

As evident from a comparison between the expression (4) and the expression (5), the electric current ($I_1$) decreases for the amount of the electric current ($I_3$) flown in the second extension wiring 6100. That is, by connecting the first extension wiring 6090 and the second extension wiring 6100, the electric current ($I_2$) flown in the first extension wiring 6090 decreases for the amount of the electric current ($I_3$) flown in the second extension wiring 6100. Thus, the electric current density of the first extension wiring 6090 is decreased and, for this, the semiconductor integrated circuit having more EM resistance can be formed.

Even in the case where there is an EM problem caused in the other second power supply wiring 6040, the same effect can be achieved by electrically connecting the first extension wiring 6090 and the second extension wiring 6100.

Figure 7:
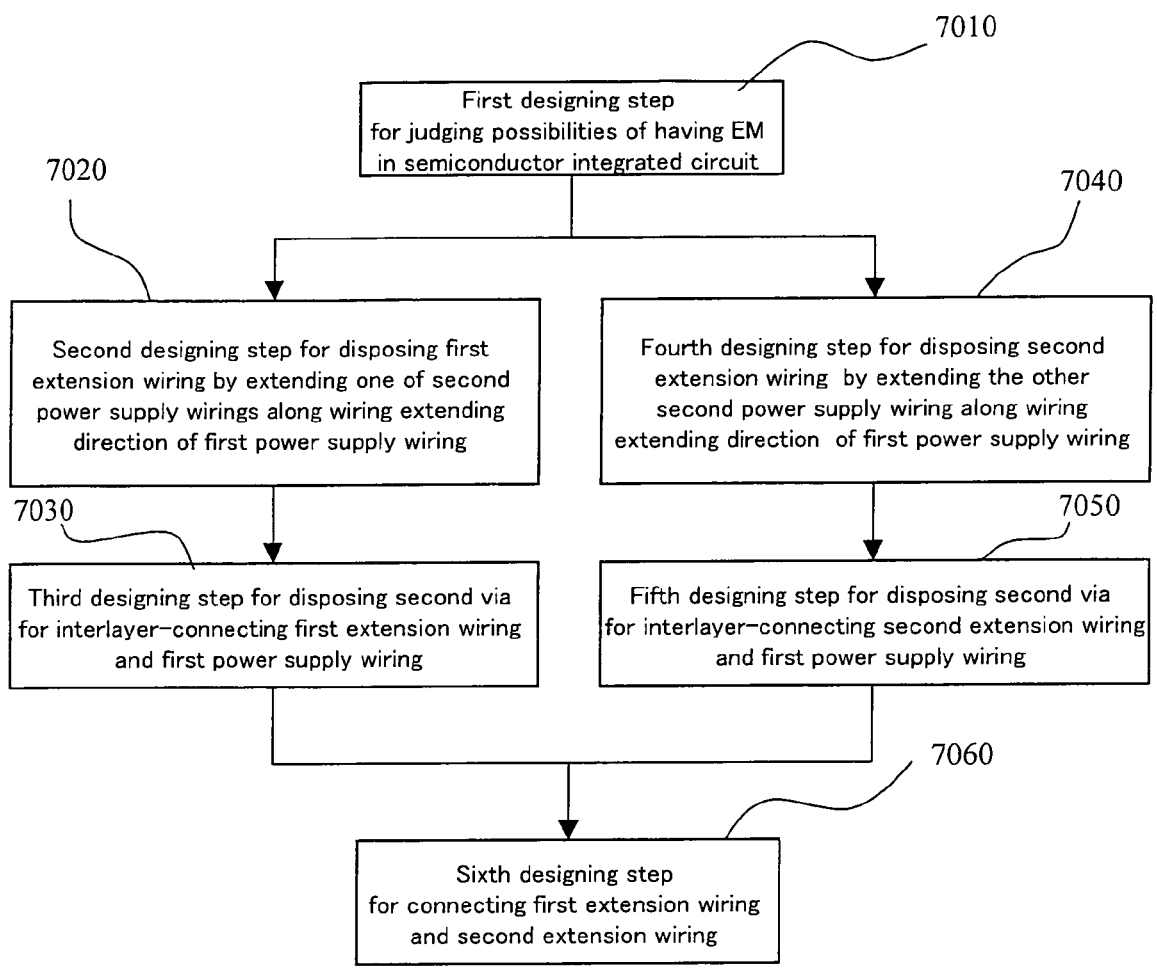
FIG. 7 is a flowchart for describing a designing method of the semiconductor integrated circuit shown in FIG. 6.

By referring to FIG. 7, described is a method of designing a semiconductor integrated circuit with the power supply wiring structure of FIG. 6.

In FIG. 7, first, a first designing step for judging the possibilities of having EM in each of the crossing areas 6060, 6070 is carried out in a semiconductor integrated circuit. A first designing step 7010 is the same as the first designing step 2160 which is described by referring to FIG. 2C.

Next, the wiring structure of the second power supply wirings 6030 in the section (the crossing area 6060) where it is judged to have possibilities of causing EM is design-modified as follows. That is, the one second power supply wiring 6030 in this part (the crossing area 6060) is extended on the other second power supply wiring side along the first power supply wiring extending direction 6020 so as to provide the first extension wiring 6090 (a second designing step 7020).

Then, the second via 6080B for interlayer-connecting the formed first extension wiring 6090 and the first power supply wiring 6010 is disposed (a third designing step 7030).

Subsequently, the wiring structure of the other second power supply wiring 6040 in the section (the crossing area 6070) where it is judged to have possibilities of causing EM is design-modified as follows. That is, the other second power supply wiring 6040 in this part (the crossing area 6070) is extended on the one second power supply wiring side along the first power supply wiring extending direction 6020 so as to provide the second extension wiring 6100 (a fourth designing step 7040).

Then, the second via 6080B for interlayer-connecting the formed first extension wiring 6100 and the first power supply wiring 6010 is disposed (a fifth designing step 7050).

The second and third designing steps 7020, 7030 and the fourth and fifth designing steps 7040, 7050 may be carried out in any orders. However, if the second power supply wirings 6030 and 6040 are connected to the first power supply wiring 6010 by two first vias 6080A, respectively, two or more of the second vias 6080B are used for connecting the first power supply wiring 6010 and the first extension wiring 6090 and for connecting the first power supply wiring 6010 and the second extension wiring 6100, respectively. Specifically, it is set so that the total numbers of the first vias 6080A at the connecting section between the first power supply wiring 6010 and the one second power supply wiring 6030 and the second vias 6080B at the connecting section between the first power supply wiring 6010 and the first extension wiring 6090 becomes the tolerance for EM or more. Similarly, it is set so that the total number of the first vias 6080A at the connecting section between the first power supply wiring 6010 and the other second power supply wiring 6040 and the second vias 6080B at the connecting section between the first power supply wiring 6010 and the second extension wiring 6100 becomes the tolerance for EM or more.

At last, the first extension wiring 6090 and the second extension wiring 6100 are coupled to be connected (a sixth designing step 7060).

With this, it is possible to attain the power supply wiring structure having no EM problem related to the number of connecting vias and also to the electric current density. Therefore, the semiconductor integrated circuit comprising this structure comes to have an excellent EM resistance.

Figure 8A:
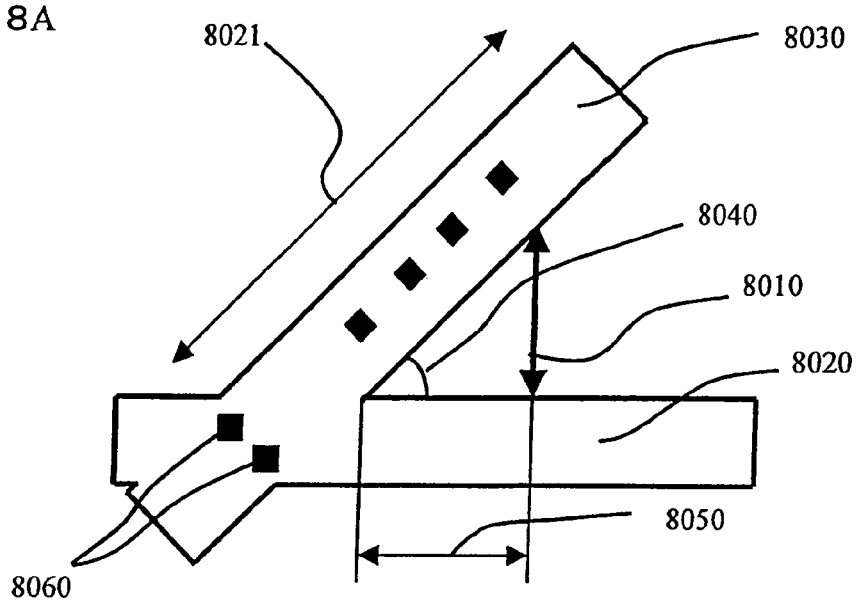
FIG. 8A-FIG. 8C are block diagrams of a semiconductor integrated circuit according to still another embodiment of the present invention.
Figure 8B:
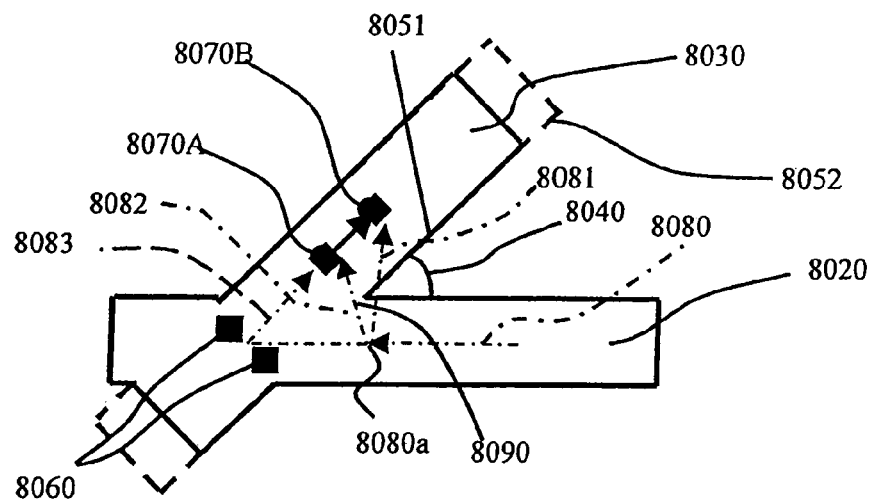
Figure 8C:
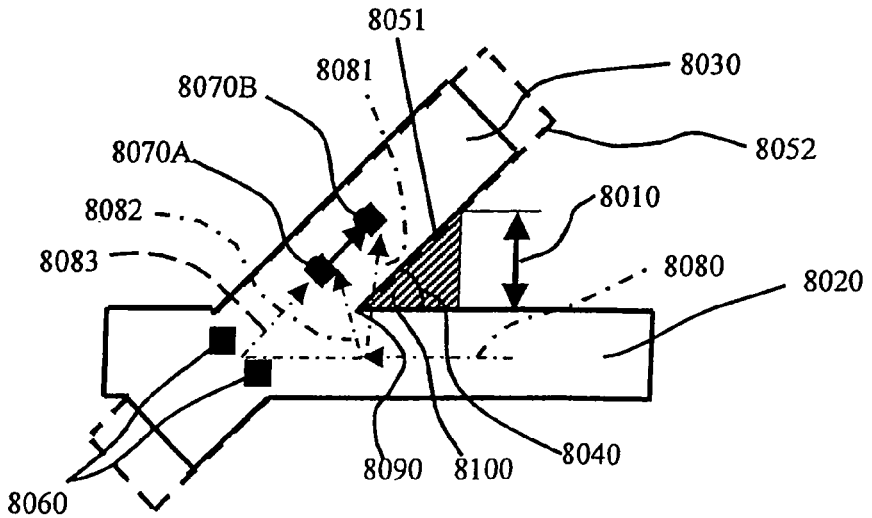

Another embodiment will be described by referring to FIG. 8A-FIG. 8C. In FIG. 8A-FIG. 8C, reference numeral 8052 is a first power supply wiring. 8020 is a second power supply wiring. 8030 is an extension wiring. The extension wiring 8030 is extended out from the second power supply wiring 8020. 8021 is a wiring extending direction of the first power supply wiring 8010. 8040 is an angle between the second power supply wiring 8020 and the extension wiring 8030. The angle 8040 is an acute angle. This indicates that the first power supply wiring 8052 crosses the second power supply wiring 8020 non-orthogonally and, similarly, the extension wiring 8030 crosses the second power supply wiring 8020 non-orthogonally.

Reference numeral 8050 is the base of a right triangle formed between the second power supply wiring 8020 and the extension wiring 8030. 8051 is the hypotenuse of the right triangle. 8060 is a first via which interlayer-connects the extension wiring 8030 and the first power supply wiring 8052. 8070A and 8070B are second vias which interlayer-connect the extension wiring 8030 and the first power supply wiring 8052. 8080 is an electric current path formed on the second power supply wiring 8020. 8081 is a first electric current path formed between the second power supply wiring 8020 and the second via 8070B. 8082 is a second electric current path formed between the second power supply wiring 8020 and the second via 8070A. 8083 is a third electric current path formed between the second power supply wiring 8020 and the extension wiring 8030. 8090 is an electric current condensed part formed between the second power supply wiring 8020 and the extension wiring 8030. 8100 is an auxiliary coupling part (hatch part). The auxiliary coupling part 8100 extends a part of the extension wiring 8030 to be coupled to the second power supply wiring 8020.

The auxiliary coupling part 8100 is provided to the electric current condensed part 8020. 8010 is a prescribed minimum wiring pitch between the extension wiring 8030 and the second power supply wiring 8020. For designing the semiconductor integrated circuit, the minimum wiring pitch 8010 indicates the minimum wiring pitch by which there is no short circuit caused between the extension wiring 8030 and the second power supply wiring 8020 when a prescribed voltage is applied to each wiring.

The auxiliary coupling part 8100 is disposed at an acute-angle-side crossing area between the extension wiring 8030 and the second power supply wiring 8020 (the power supply wiring where the extension wiring is provided). The auxiliary coupling part 8100 is extended out from the wiring edge of the extension wiring 8030 to be coupled to the wiring edge of the second power supply wiring 8020. The auxiliary coupling part 8100 is in a right triangular shape having the wiring edge of the extension wiring 8030 as the hypotenuse and the wiring edge of the second power supply wiring 8020 as the base. The height of the auxiliary coupling part 8100 is set to be in the size (the minimum wiring pitch 8010) so that there is no short circuit caused between the extension wiring 8030 and the second power supply wiring 8020 when a prescribed voltage is applied to each wiring.

The first power supply wiring 8052, the second power supply wiring 8020, and the extension wiring 8030 of this embodiment have the same configurations as those of the first power supply wiring 1010, the second power supply wiring 1030, and the extension wiring 1070, which are described by referring to FIG. 1. However, the extension wiring 8030 and the second power supply wiring 8020 are coupled non-orthogonally (not at an angle of about 90°).

In FIG. 8A, the second power supply wiring 8020 and the extension wiring 8030 are the same wiring layer. The "same wiring layer" means the wirings which are disposed as the same wiring pattern on the same plane. That is, the extension wiring 8030 is in a coupled shape which is extended out from the second power supply wiring 8020, and both wirings 8030, 8020 are of the same wiring layer. The extension wiring 8030 is formed by extending a part of the second power supply wiring 8020 towards the wiring extending direction 8021 of the first power supply wiring 8052. The second power supply wiring 8020 and the extension wiring 8030 are formed in the same wiring layer The second power supply wiring 8020 and the first power supply wiring 8052 are interlayer-connected by the first via 8060.

In the wiring structure having the above-described configuration, the electric current (I) in the electric current path 8080 of the second power supply wiring 8020 can be expressed as follows, where, the electric current in the first electric current path 8081 is ($I_1$), the electric current in the second electric current path 8082 is ($I_2$), and the electric current in the third electric current path 8083 is ($I_3$):

$$(I)=(I_1)+(I_2)+(I_3) \quad (6)$$

Here, there is set a point 8080a at which the second electric current path 8080 between the second via 8070A and the second power supply wiring 8020 branches. With this, the second electric current path 8082 becomes an electric current path for linearly coupling the branch point 8080a and the second via 8070A. In the meantime, the third electric current path 8083 becomes an electric current path which couples the branch point 8080a and the second via 8070A through the coupled part between the second power supply wiring 8020 and the extension wiring 8030.

Thus, when the lengths of both of the electric current paths 8082 and 8083 are compared, the second electric current path 8082 is shorter than the third electric current path 8083. Because of these reasons, the electric current ($I_2$) flown in the second electric current path 8082 becomes larger than the electric current ($I_3$) flown in the third electric current path 8083.

Similarly, there is set a point 8080a at which the first electric current path 8081 between the second via 8070B and the second power supply wiring 9020 branches. With this, the first electric current path 8081 becomes an electric current path for linearly coupling the branch point 8080a and the second via 8070B. In the meantime, the third electric current path 8083 becomes an electric current path which couples the branch point 8080a and the second via 8070B through the coupled part between the second power supply wiring 8020 and the extension wiring 8030.

Thus, when the lengths of both of the electric current paths 8081 and 8083 are compared, the first electric current path 8081 is shorter than the third electric current path 8083. Because of these reasons, the electric current ($I_1$) flown in the first electric current path 8081 becomes larger than the electric current ($I_3$) flown in the third electric current path 8083.

By adopting such relation of the amount of the electric current into the above-described expression (6), it is found that the electric current ($I_2$) of the second electric current path 8082 and the electric current ($I_3$) of the third electric current path 8083 are larger than the electric current ($I_1$) of the first electric current path 8081. Thus, when the second power supply wiring 8020 and the third power supply wiring 8030 are connected by being abutted to each other at an acute angle 8040, the electric current condensed part 8090 is formed in an area where the electric current ($I_2$) and the electric current ($I_3$) overlap. When the electric current condensed part 8090 is formed, it becomes difficult to decrease the EM.

Thus, as shown in FIG. 8C, it is assumed that, between the second power supply wiring 8020 and the extension wiring 8030, there is a right triangle having an edge of the second power supply wiring 8020 on the upper side of the drawing as the base, and edge of the extension wiring 8030 on the lower side of the drawing as one of the hypotenuses, and the minimum wiring pitch 8010 as the other. Then, the auxiliary coupling part 8100 is disposed to fill in the area smaller than the assumed right triangle.

In the power supply wiring structure described above, it is possible to keep the sufficient minimum wiring pitch 8010 necessary for forming the wiring by proving the auxiliary coupling part 8100. Thus, there is no inconvenience caused such as short circuit, etc. in terms of designing. Further, since the auxiliary coupling part 8100 is provided, the area of the power supply wiring is increased. For this, it enables to avoid concentration of the electric current in the electric current condensed part 8090. That is, the electric current density can be reduced so that the semiconductor integrated circuit having the EM resistance can be formed.

Figure 9:
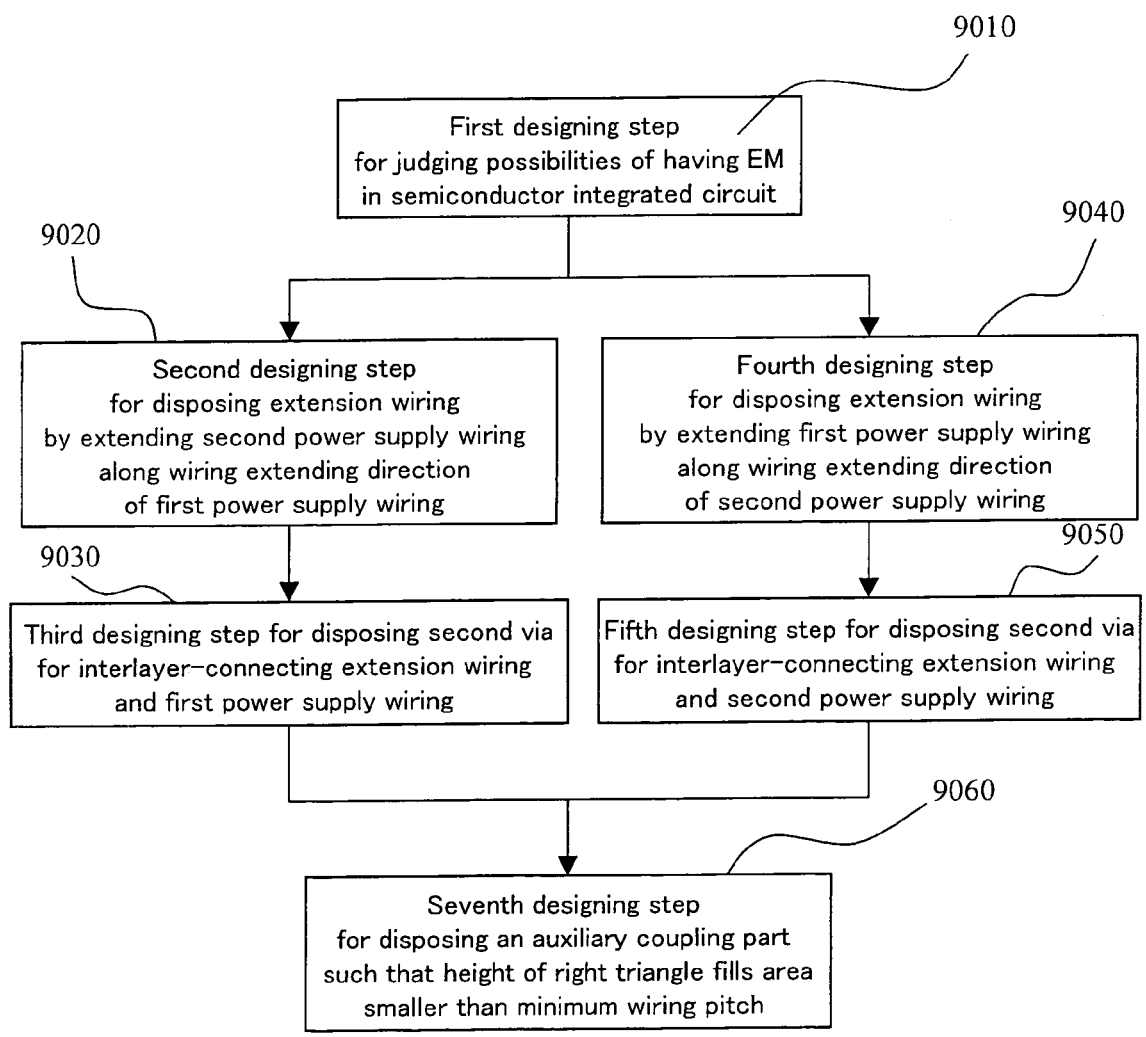
FIG. 9 is a flowchart for describing the semiconductor integrated circuit shown in FIG. 8.

By referring to FIG. 9, described is a method of designing a semiconductor integrated circuit using the power supply wiring structure shown in FIG. 8. In FIG. 9, first, a first designing step 9010 for judging the possibilities of having EM in each of the power supply wirings 8052, 8020, 8030 is carried out in a semiconductor integrated circuit. The first designing step 9010 is the same as the first designing step 2160 which is described by referring to FIG. 2C.

Then, the wiring structure of the second power supply wirings 8020 in the section (the crossing area) where it is judged to have possibilities of causing EM is design-modified as follows. That is, the second power supply wiring 8020 in this part (the crossing area) is extended along the first power supply wiring extending direction 8021 so as to provide the extension wiring 8030 (a second designing step 9020).

Then, the first and second vias 8070A, 8070B for connecting the formed extension wiring 8030 and the first power supply wiring 8052 is disposed (a third designing step 9030).

Subsequently, the wiring structure of the first power supply wiring 8052 in the section (the crossing area) where it is judged to have possibilities of causing EM is design-modified as follows. That is, the first power supply wiring 8052 in this part (the crossing area) is extended along the second power supply wiring extending direction so as to provide the extension wiring (not shown) (a fourth designing step 9040).

Then, the second via (not shown) for connecting the formed extension wiring and the second power supply wiring 8020 is disposed (a fifth designing step 9050).

Subsequently, an auxiliary coupling part (not shown) is disposed at a crossing area between the second power supply wiring 8020 and the third power supply wiring 8030, and at a crossing area between the first power supply wiring 8052 and the fourth power supply wiring (a seventh designing step 9060).

By performing the above-described semiconductor integrated circuit designing method, it enables to design the semiconductor integrated circuit having the EM resistance.

Figure 10:
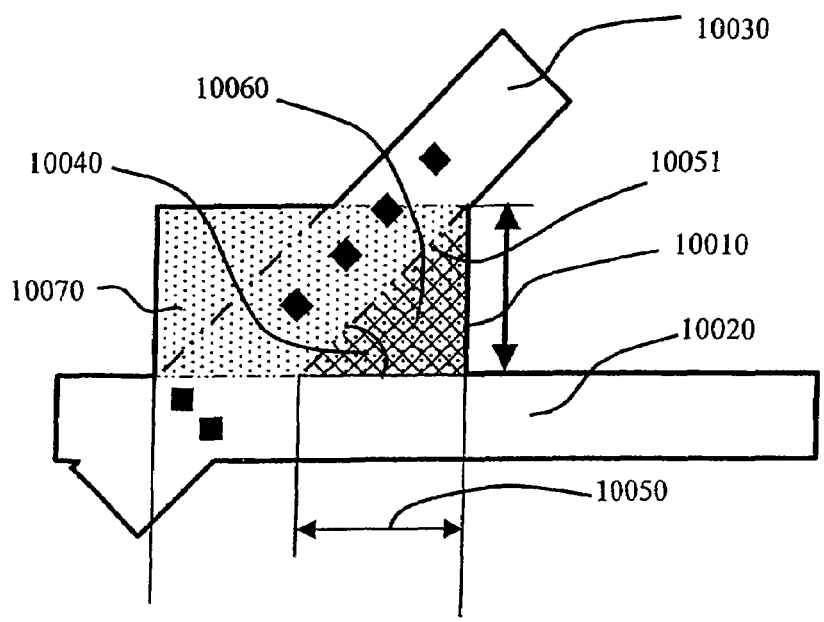
FIG. 10 is a block diagram of a semiconductor integrated circuit according to yet another embodiment of the present invention.

Another embodiment will be described by referring to FIG. 10. This structure is basically the same as the structure shown in FIG. 8A-8C. In FIG. 10, reference numeral 10020 is a second power supply wiring. 10030 is an extension wiring. 10010 indicates the wiring isolation pitch between the second power supply wiring 10020 and the third power supply wiring 10030. 10060 is a right triangle formed by an area surrounded by the second power supply wiring 10020, the extension wiring 10030, and the wiring isolation pitch 10010. The wiring isolation pitch 10010 corresponds to the height of the right triangle 10060. 10040 is an interior angle of the right triangle 10060. The interior angle 10040 becomes a crossing angle between the second power supply wiring 10020 and the extension wiring 10030. 10050 is the base of the right triangle 10060. The base 10050 is formed by an edge of the second power supply wiring 10020 on the upper side of the drawing. 10051 is a hypotenuse of the right triangle 10060. The hypotenuse 10051 is formed by an edge of the extension wiring 10030 on the lower side of the drawing. 10070 is an auxiliary coupling part which is formed by extending a part of the second power supply wiring 10020 towards the extension wiring side. The auxiliary coupling part 10070 is in a rectangular shape having the wiring isolation pitch 10010 as the height.

Figure 11:
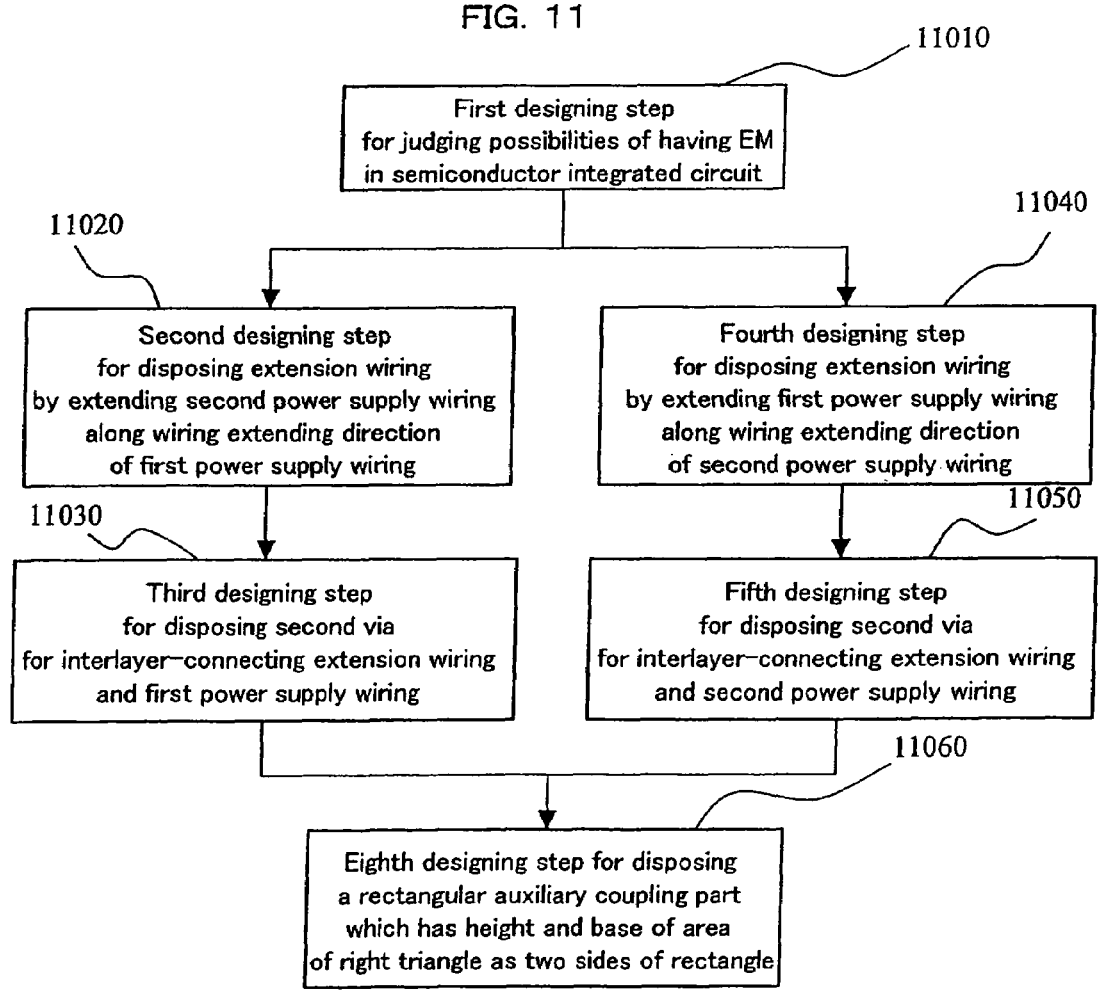
FIG. 11 is a flowchart for describing a designing method of the semiconductor integrated circuit shown in FIG. 10.

By referring to FIG. 11, described is a method of designing a semiconductor integrated circuit using the power supply wiring structure shown in FIG. 10. In FIG. 11, first, a first designing step 11010 for judging the possibilities of having EM in each of the power supply wirings 10020, 10030, etc. is carried out in a semiconductor integrated circuit. The first designing step 11010 is the same as the first designing step 2160 which is described by referring to FIG. 2C.

Then, the wiring structure of the second power supply wirings 11030 in the section (the crossing area) where it is judged to have possibilities of causing EM is design-modified as follows. That is, the second power supply wiring 11020 in this part (the crossing area) is extended along the first power supply wiring extending direction so as to provide the extension wiring 11030 (a second designing step 11020).

Then, the second via for connecting the formed extension wiring 11030 and the first power supply wiring 11052 is disposed (a third designing step 11030).

Subsequently, the wiring structure of the first power supply wiring (not shown) in the section (the crossing area) where it is judged to have possibilities of causing EM is design-modified as follows. That is, the first power supply wiring in this part (the crossing area) is extended along the second power supply wiring extending direction so as to provide the extension wiring (not shown) (a fourth designing step 11040).

Then, the second via (not shown) for connecting the formed extension wiring and the second power supply wiring 11020 is disposed (a fifth designing step 11050).

Next, a rectangular auxiliary coupling part 10070 (not shown), which has the height and the base of the area 10060 of the right triangle as the two sides of the rectangular, is disposed at a crossing area between the second power supply wiring 11020 and the extension wiring 8030, and at a crossing area between the first power supply wiring 11052 and the extension wiring (an eighth designing step 11060).

By performing the above-described semiconductor integrated circuit designing method, it enables to design the semiconductor integrated circuit having the EM resistance.

Figure 12:
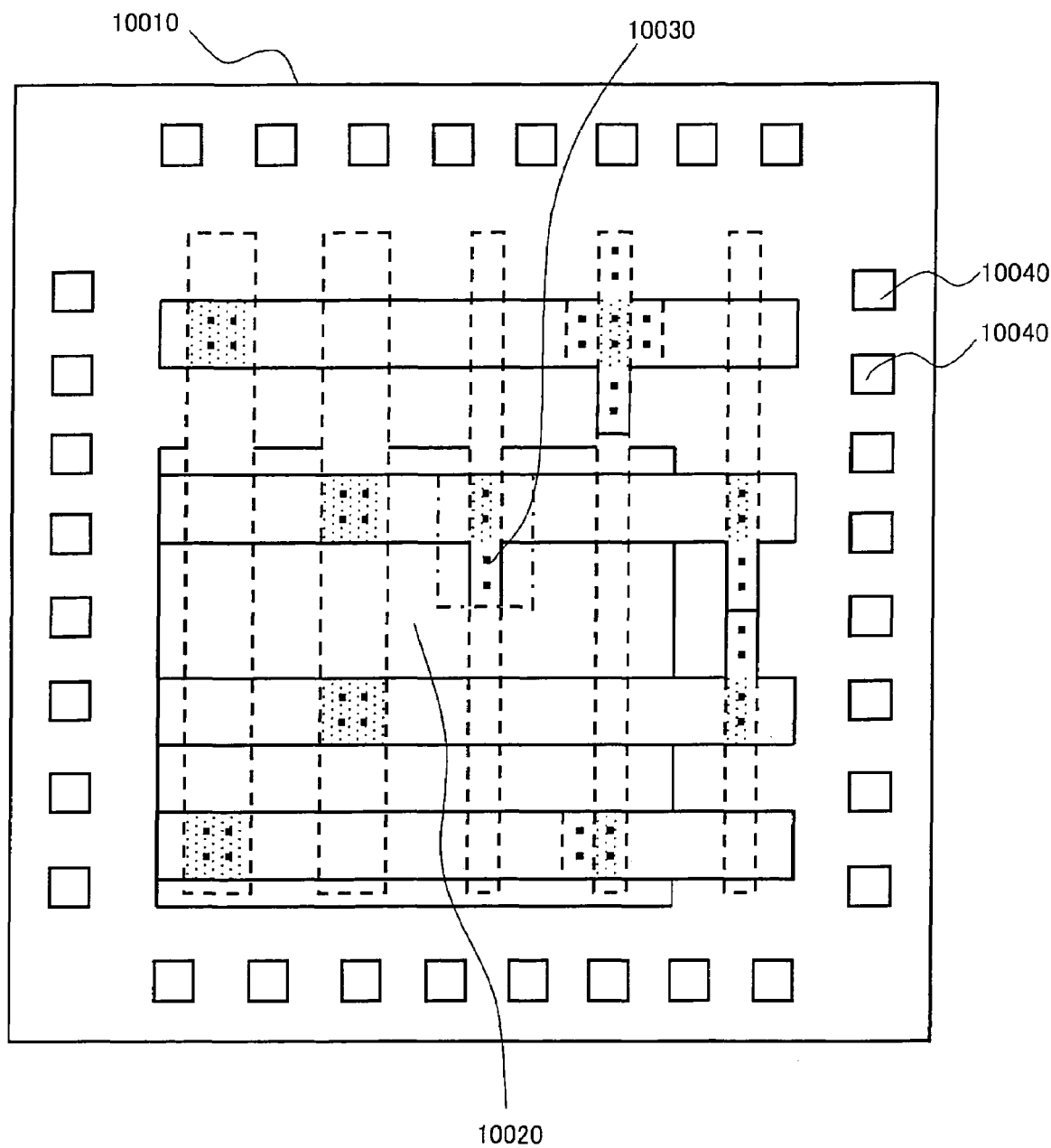
FIG. 12 is a block diagram of a semiconductor integrated circuit which comprises the power supply wiring structure of the present invention.
Figure 14A:
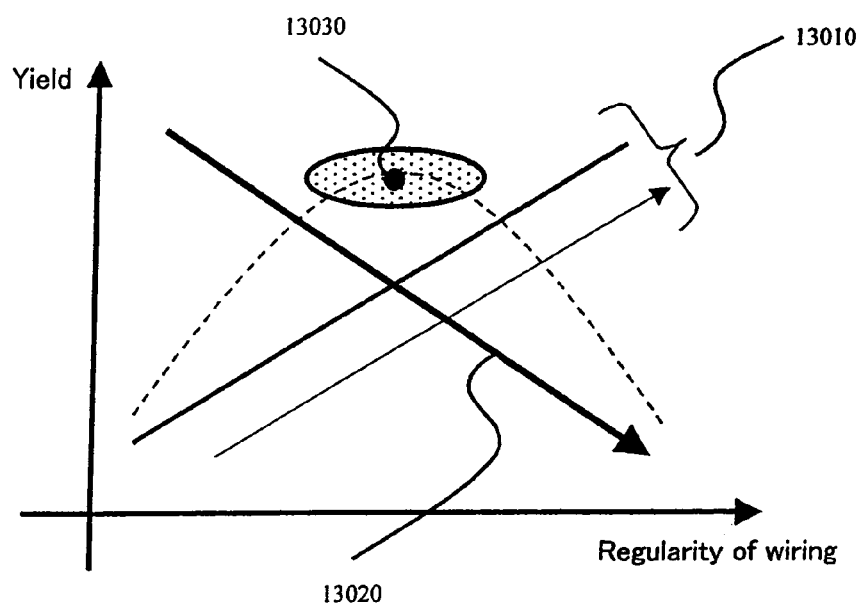
FIG. 14A-FIG. 14C are graphs related to the via of the semiconductor integrated circuit, which is found by the inventors of the present invention.
Figure 14B:
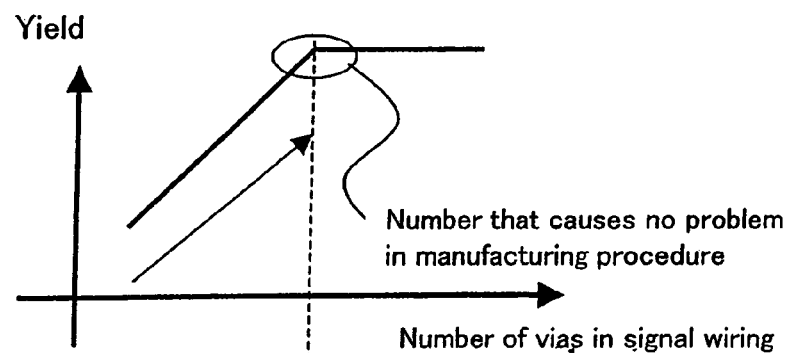
Figure 14C:
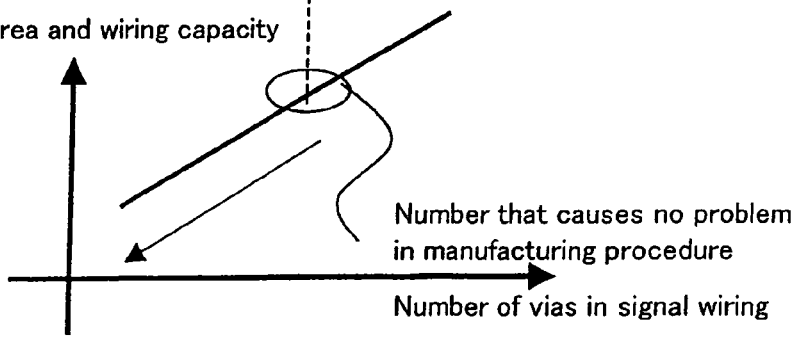

Next, a semiconductor integrated circuit comprising the power supply wiring structure of the present invention will be described by referring to FIG. 12. This semiconductor integrated circuit 10010 comprises a plurality of power supply wirings disposed in a lattice form, a semiconductor device 10020, and pads disposed around the power supply wirings and the semiconductor device. To each of the power supply wirings, power supply potential or ground potential is supplied from a power supply pad 10040, which is one of a plurality of kinds of pads. A part 10030 is the power supply wiring structure of the present invention shown in FIG. 1 and he like, in which, at the crossing area of the two power supply wirings, one of the power supply wirings is extended along the extending direction of the other power supply wiring for connecting both power supply wirings by a pressure of via. The semiconductor integrated circuit 10020 is a circuit block for achieving a prescribed function, which, although not shown, is electrically connected to the lattice-form power supply wirings and operates by receiving a supply of the power supply potential and the ground potential.

The present invention has been described in detail by referring to the most preferred embodiments. However, it is not intended to be limited to the preferred embodiments but various combinations and modifications of the components are possible without departing from the sprit and the broad scope of the appended claims.

What is claimed is:

1. A power supply wiring structure, comprising:
   a first and a second power supply wirings, which are disposed on different planes to cross each other two-dimensionally;
   a first via for interlayer-connecting said first and said second power supply wirings at a crossing area where said power supply wirings cross each other;
   extension wirings which are formed by partially extending at least either said first power supply wiring or said second power supply wiring from both sides of said crossing area along a wiring extending direction of other power supply wiring; and
   a second via for interlayer-connecting said extension wiring and either said first power supply wiring or said second power supply wiring, said first or said second power supply wirings being disposed on a plane different from said extension wiring to face said extension wiring.

2. The power supply wiring structure as claimed in claim 1, wherein said extension wiring is provided adjacent to said crossing area.

3. The power supply wiring structure as claimed in claim 2, wherein
   a mounting number of said first via disposed in each said crossing area is set according to size of respective said crossing area.

4. The power supply wiring structure as claimed in claim 1, wherein said extension wiring is provided to said first power supply wiring.

5. The power supply wiring structure as claimed in claim 1, wherein said extension wiring is provided to said second power supply wiring.

6. The power supply wiring structure as claimed in claim 1, wherein said extension wiring is provided to said first power supply wiring and said second power supply wiring, respectively.

7. The power supply wiring structure as claimed in claim 1, wherein:
- said second power supply wirings in a plurality of numbers are provided in parallel to each other; and
- said extension wiring comprises
  - a first extension wiring which is formed by partially extending one of said second power supply wirings towards other one of said second power supply wirings along a wiring extending direction of said first power supply wiring, and
  - a second extension wiring which is formed by partially extending said other second power supply wiring towards said one of said second power supply wirings along said wiring extending direction of said first power supply wiring, wherein
- said first extension wiring and said second extension wiring are connected by abutting against each other.

8. The power supply wiring structure as claimed in claim 1, wherein:
- said extension wiring is coupled non-orthogonally to said power supply wiring where said extension wiring is provided;
- said extension wiring comprises an auxiliary coupling part for further coupling said extension wiring to said power supply wiring where said extension wiring is provided;
- at an acute-angle-side crossing area between said extension wiring and said power supply wiring where said extension wiring is provided, said auxiliary coupling part is extended out from a wiring edge of said extension wiring and coupled to a wiring edge of said power supply wiring where said extension wiring is provided;
- said auxiliary coupling part is in a right triangular shape having said wiring edge of said extension wiring as a hypotenuse and having said wiring edge of said power supply wiring where said extension wiring is provided as a base; and
- a height of said auxiliary coupling part is in a size by which there is no short circuit caused between said power supply wiring where said extension wiring is provided and said extension wiring when a prescribed voltage is applied to said first and said second power supply wirings.

9. The power supply wiring structure as claimed in claim 8, wherein said auxiliary coupling part is formed in a rectangular shape having said height and said base of said right triangular shape as its two sides.

10. A semiconductor integrated circuit, comprising
- a power supply wiring structure as claimed in claim 1, and
- a semiconductor device connected to said power supply wiring structure.

11. A power supply wiring structure, comprising a first and a second power supply wirings, which are disposed on different planes to cross each other two-dimensionally, wherein:
- said second power supply wirings in a plurality of numbers are provided in parallel to each other; and
- said power supply wiring structure comprises
  - a first extension wiring which is formed by partially extending one of said second power supply wirings at a crossing area where said first and said second power supply wirings cross each other towards other one of said second power supply wirings along a wiring extending direction of said first power supply wiring, and
  - a second extension wiring which is formed by partially extending said other second power supply wiring at a crossing area where said first and said second power supply wirings cross each other towards said one of said second power supply wirings along said wiring extending direction of said first power supply wiring, wherein
- said first extension wiring and said second extension wiring are connected by abutting against each other.

* * * * *